(12) United States Patent
Seo et al.

(10) Patent No.: US 10,811,408 B2
(45) Date of Patent: Oct. 20, 2020

(54) SEMICONDUCTOR DEVICE INCLUDING A GATE INSULATION PATTERN AND A GATE ELECTRODE PATTERN

(71) Applicant: SAMSUNG ELECTRONICS CO., LTD., Suwon-si, Gyeonggi-do (KR)

(72) Inventors: Hyeoungwon Seo, Yongin-si (KR); Wonsok Lee, Suwon-si (KR); Min Hee Cho, Suwon-si (KR); Hyun-Sook Byun, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/952,798

(22) Filed: Apr. 13, 2018

(65) Prior Publication Data

US 2019/0067278 A1    Feb. 28, 2019

(30) Foreign Application Priority Data

Aug. 28, 2017    (KR) .......................... 10-2017-0108885

(51) Int. Cl.
| | | |
|---|---|---|
| *H01L 27/088* | (2006.01) | |
| *H01L 29/06* | (2006.01) | |
| *H01L 29/49* | (2006.01) | |
| *H01L 29/423* | (2006.01) | |
| *H01L 29/78* | (2006.01) | |

(52) U.S. Cl.
CPC ...... *H01L 27/0886* (2013.01); *H01L 29/0649* (2013.01); *H01L 29/4236* (2013.01); *H01L 29/4966* (2013.01); *H01L 29/7851* (2013.01)

(58) Field of Classification Search
None
See application file for complete search history.

(56) References Cited

U.S. PATENT DOCUMENTS

| | | |
|---|---|---|
| 6,709,926 B2 | 3/2004 | Chidambarrao et al. |
| 6,770,535 B2 | 8/2004 | Yamada et al. |
| 6,873,010 B2 | 3/2005 | Chidambarrao et al. |
| 7,060,619 B2 | 6/2006 | Cowley et al. |
| 7,241,655 B2 | 7/2007 | Tang et al. |

(Continued)

FOREIGN PATENT DOCUMENTS

| | | |
|---|---|---|
| JP | 2016046456 | 4/2016 |
| KR | 100720642 | 5/2007 |

(Continued)

*Primary Examiner* — Lex H Malsawma
(74) *Attorney, Agent, or Firm* — F. Chau & Associates, LLC

(57) ABSTRACT

A semiconductor device includes a substrate including an active region defined by a device isolation layer. A word line structure is in a trench formed in an upper portion of the substrate. The word line structure includes a gate insulation pattern covering an inner surface of the trench. A gate electrode pattern is on the gate insulation pattern. A first work function pattern is between the gate insulation pattern and the gate electrode pattern. A second work function pattern is on the first work function pattern and extends along a side surface of the gate electrode pattern. The first work function pattern has a top surface at a level below that of a bottom surface of the gate electrode pattern. The first work function pattern has a work function greater than that of the second work function pattern.

20 Claims, 25 Drawing Sheets

(56) References Cited

U.S. PATENT DOCUMENTS

| | | |
|---|---|---|
| 7,294,879 B2 | 11/2007 | Chen et al. |
| 7,335,936 B2 | 2/2008 | Sommer et al. |
| 7,354,822 B2 | 4/2008 | Chen et al. |
| 8,357,600 B2 | 1/2013 | Shin et al. |
| 8,692,320 B2 | 4/2014 | Gibbons et al. |
| 8,896,059 B1 | 11/2014 | Kim |
| 8,901,630 B2 | 12/2014 | Huh et al. |
| 9,240,453 B2 | 1/2016 | Oh |
| 9,443,735 B2 | 9/2016 | Kim et al. |
| 9,589,960 B1 * | 3/2017 | Min ............... H01L 27/105 |
| 10,304,684 B2 * | 5/2019 | Jang ............ H01L 21/28088 |
| 2009/0173994 A1 | 7/2009 | Min et al. |
| 2013/0260549 A1 * | 10/2013 | Jagannathan ..... H01L 21/28518 438/592 |
| 2015/0214313 A1 | 7/2015 | Oh et al. |
| 2015/0214314 A1 * | 7/2015 | Oh ................. H01L 29/4236 257/330 |
| 2016/0172488 A1 | 6/2016 | Oh et al. |
| 2016/0315088 A1 | 10/2016 | Kang et al. |
| 2017/0125422 A1 | 5/2017 | Kang |
| 2017/0125532 A1 | 5/2017 | Jang |
| 2017/0186844 A1 | 6/2017 | Kim et al. |
| 2018/0174845 A1 * | 6/2018 | Jang ............ H01L 29/66666 |

FOREIGN PATENT DOCUMENTS

| | | |
|---|---|---|
| KR | 1020130110599 | 10/2013 |
| KR | 1020150011925 | 2/2015 |
| KR | 1020150090666 | 8/2015 |

\* cited by examiner

SEMICONDUCTOR DEVICE INCLUDING A GATE INSULATION PATTERN AND A GATE ELECTRODE PATTERN

CROSS-REFERENCE TO RELATED APPLICATION

This U.S. nonprovisional patent application claims priority under 35 U.S.C. § 119 to Korean Patent Application No. 10-2017-0108885 filed on Aug. 28, 2017 the disclosure of which is incorporated by reference herein in its entirety.

TECHNICAL FIELD

Exemplary embodiments of the present inventive concept relate to a semiconductor device, and more particularly to a semiconductor device including a gate insulation pattern and a gate electrode pattern.

DISCUSSION OF RELATED ART

Semiconductor devices may be in the electronics industry because of their relatively small size, multi-function, and/or relatively low fabrication cost. Semiconductor devices may be categorized as any one of semiconductor memory devices storing logic data, semiconductor logic devices processing operations of logic data, and hybrid semiconductor devices having both memory and logic elements.

Semiconductor devices included in electronic products may have a relatively high operating speed and/or a relatively low operating voltage. Semiconductor devices may be relatively highly integrated. The high integration of semiconductor devices may reduce the reliability of semiconductor devices. However, research has been conducted for increasing the reliability of semiconductor devices.

SUMMARY

An exemplary embodiment of the present inventive concept provides a semiconductor device having electrical conductivity with increased accuracy and a semiconductor device with increased reliability and a relatively low defect rate.

An exemplary embodiment of the present inventive concept provides a semiconductor device having reduced leakage current.

According to an exemplary embodiment of the present inventive concept, a semiconductor device includes a substrate including an active region defined by a device isolation layer. A word line structure is in a trench formed in an upper portion of the substrate. The word line structure includes a gate insulation pattern covering an inner surface of the trench. A gate electrode pattern is on the gate insulation pattern. A first work function pattern is between the gate insulation pattern and the gate electrode pattern. A second work function pattern is on the first work function pattern and extends along a side surface of the gate electrode pattern. The first work function pattern has a top surface at a level below that of a bottom surface of the gate electrode pattern. The first work function pattern has a work function greater than that of the second work function pattern.

According to an exemplary embodiment of the present inventive concept, a semiconductor device includes a device isolation layer. An active fin region protrudes from a top surface of the device isolation layer. A word line structure is on the device isolation layer. The word line structure includes a gate electrode pattern. A first work function pattern is between the gate electrode pattern and the active fin region. A second work function pattern is between the first work function pattern and the gate electrode pattern and extends along a side surface of the gate electrode pattern. The first work function pattern has a work function greater than that of the second work function pattern.

According to an exemplary embodiment of the present inventive concept, a semiconductor device includes a device isolation layer defining a fin region. At least one trench is formed below an upper surface of the device isolation layer. The fin region includes a gate insulation pattern disposed on side surfaces and an upper surface of the fin region. A first work function pattern is disposed on the gate insulation pattern. A second work function pattern is disposed on the first work function pattern. A gate electrode pattern is disposed on the second work function pattern. The at least one trench includes the gate insulation pattern conformally disposed on side surfaces and a bottom surface of the at least one trench. The first work function pattern is disposed on a portion of the gate insulation pattern disposed on the bottom surface of the at least one trench. The second work function pattern is disposed on a portion of the gate insulation pattern disposed on the side surfaces of the at least one trench and on the first work function pattern on the bottom surface of the at least one trench. The gate electrode pattern is disposed on the second work function pattern in the at least one trench.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF EMBODIMENTS

Figure 1:
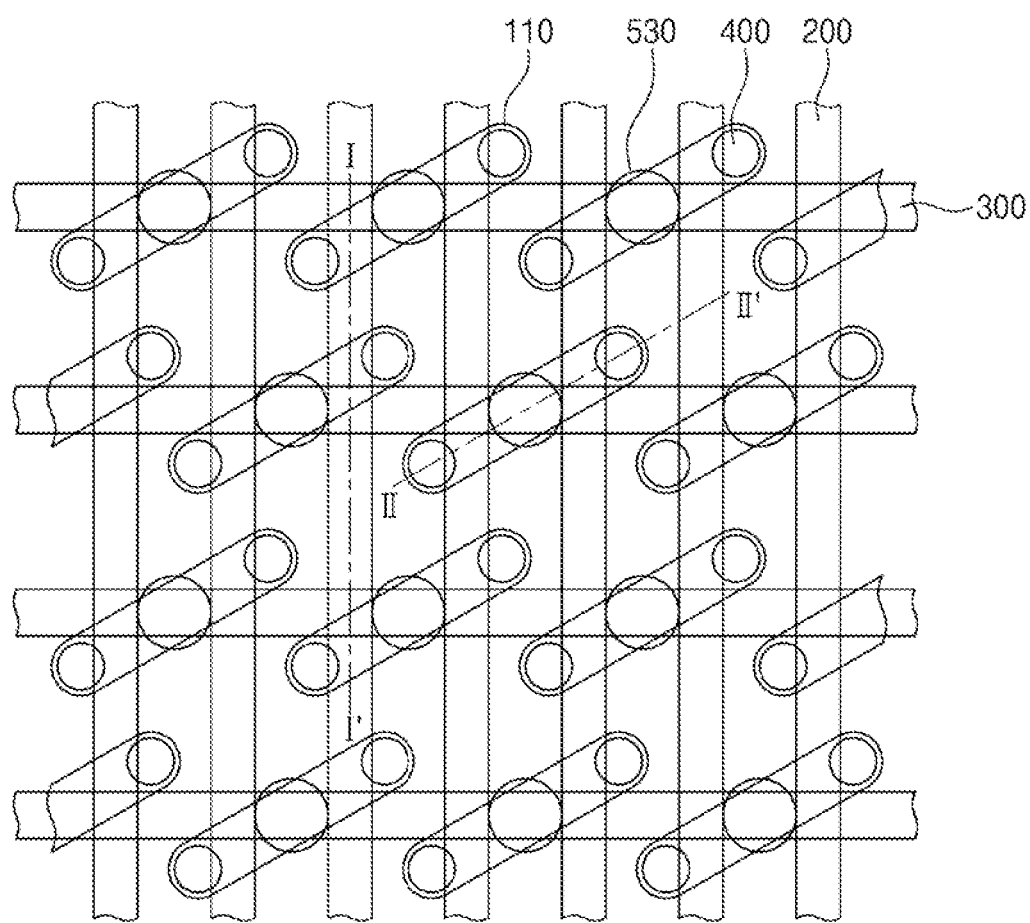
FIG. 1 illustrates a plan view of a semiconductor device according to an exemplary embodiment of the present inventive concept.
Figure 1:
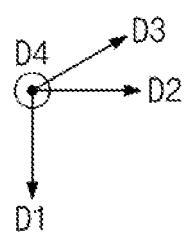
Figure 2:
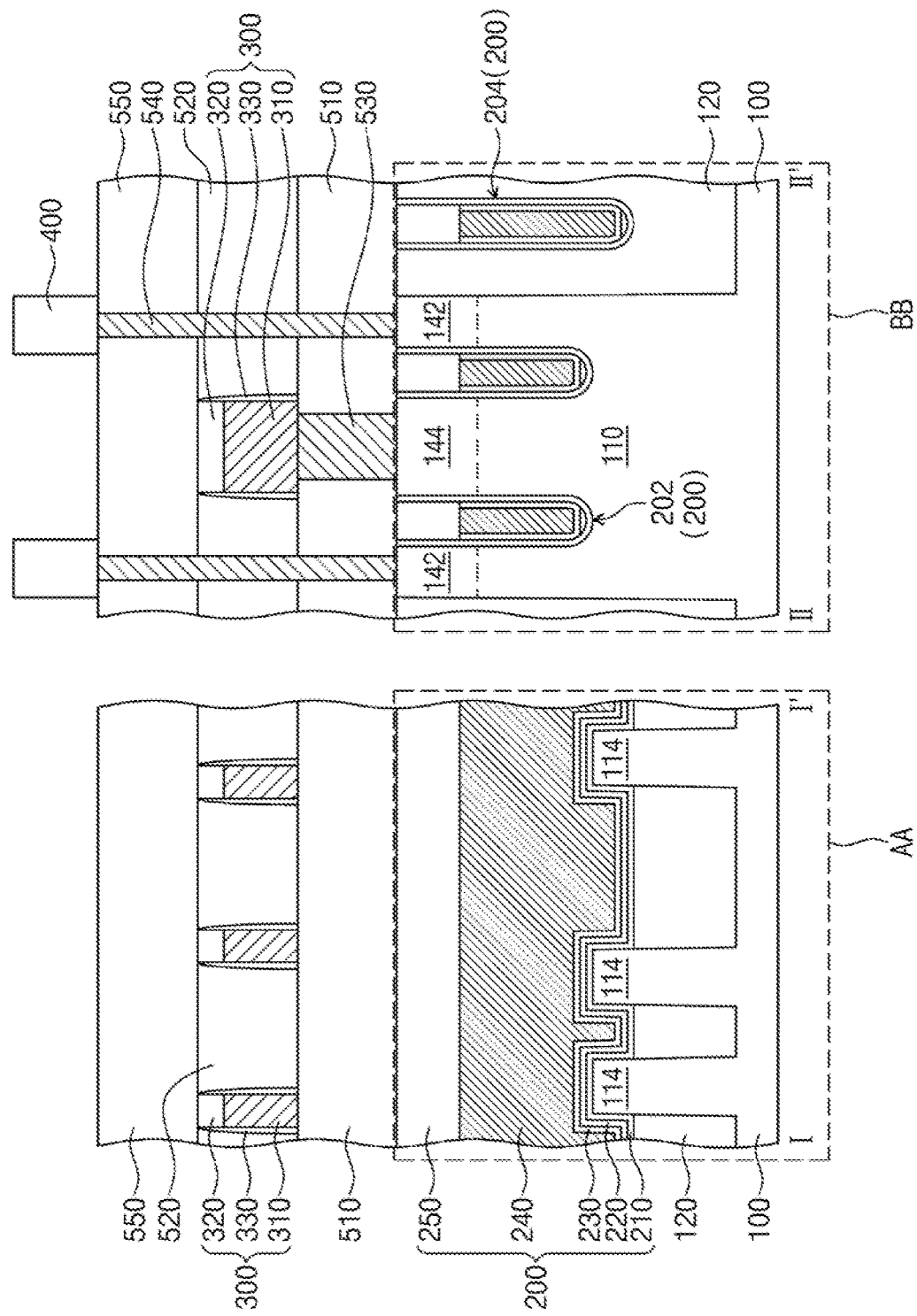
FIG. 2 illustrates a cross-sectional view taken along lines I-I' and II-II' of FIG. 1.
Figure 2A:
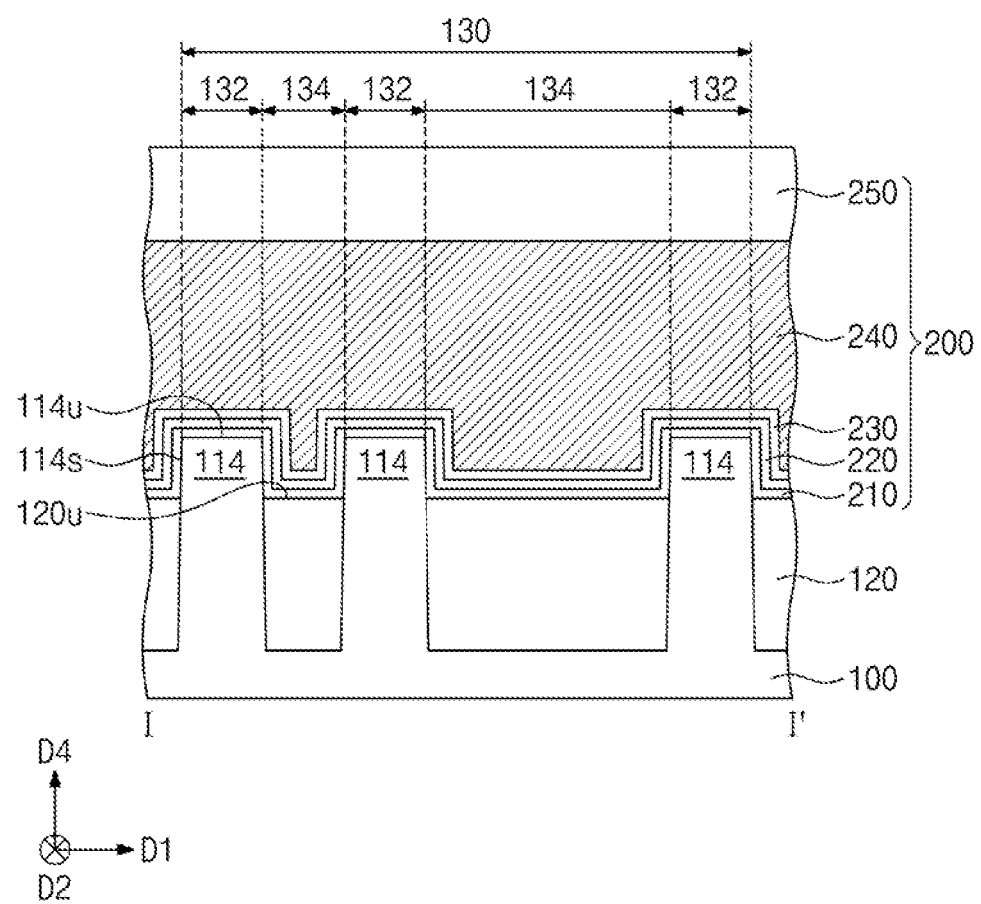
FIG. 2A illustrates an enlarged view of section AA of FIG. 2.
Figure 2B:
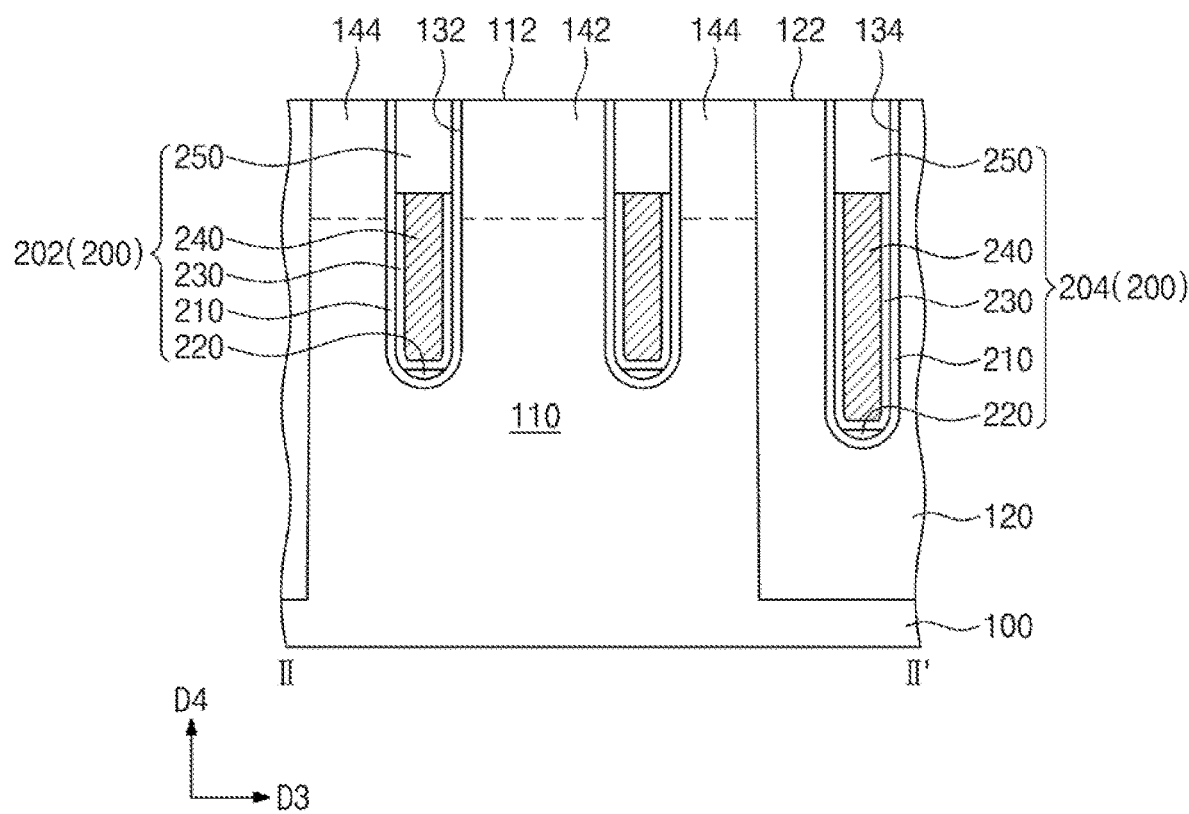
FIG. 2B illustrates an enlarged view of section BB of FIG. 2.

FIG. 1 illustrates a plan view of a semiconductor device according to an exemplary embodiment of the present inventive concept. FIG. 2 illustrates a cross-sectional view taken along lines I-I' and II-II' of FIG. 1. FIG. 2A illustrates an enlarged view of section AA of FIG. 2. FIG. 2B illustrates an enlarged view of section BB of FIG. 2.

Referring to FIGS. 1, 2, 2A, and 2B, a semiconductor device may include a substrate 100, word line structures 200, bit line structures 300, and data storage elements 400. The substrate 100 may be a semiconductor substrate. For example, the substrate 100 may be a silicon (Si) substrate, a germanium (Ge) substrate, a silicon-germanium (SiGe) substrate, or a compound semiconductor substrate such as a gallium-arsenic (GaAs) substrate.

The substrate 100 may include active regions 110 defined by a device isolation layer 120. The active regions 110 may be areas where electronic devices are formed. When viewed in plan, each of the active regions 110 may have an island shape extending in a third direction D3 crossing each of first and second directions D1 and D2. The first to third directions D1 to D3 may cross each other while being parallel to a top surface 112 of each of the active regions 110 and a top surface 122 of the device isolation layer 120.

When viewed in a plan view, the device isolation layer 120 may surround sidewalls of each of the active regions 110. The device isolation layer 120 may electrically separate the active regions 110 from each other. The device isolation layer 120 may fill spaces between the active regions 110. The device isolation layer 120 may have a top surface 122 substantially coplanar with the top surface 112 of each of the active regions 110 (e.g., along a direction parallel to an upper surface of the substrate 100). The device isolation layer 120 may include an insulating material. For example, the device isolation layer 120 may include one or more of silicon oxide, silicon nitride, or silicon oxynitride.

A trench 130 may be provided in the substrate 100. The trench 130 may extend in the first direction D1. A plurality of trenches 130 may be arranged in the second direction D2. The plurality of trenches 130 arranged in the second direction D2 may be spaced apart from each other. The trench 130 may form recesses the active regions 110 and the device isolation layer 120. The trench 130 may include a shallow trench 132 in the active region 110 and a deep trench 134 in the device isolation layer 120. The shallow trench 132 may have a depth less than that of the deep trench 134 (e.g., along the fourth direction D4, which may be orthogonal to an upper surface of the substrate 100). For example, the depth of the trench 130 may refer to a depth of the trench 130 when measured in a fourth direction D4.

The trench 130 may define a fin region 114 of the active region 110. For example, the fin region 114 may be defined by the shallow trench 132 and the deep trench 134. The fin region 114 may have a top surface 114$u$ exposed to the shallow trench 132, and may have a side surface 114$s$ exposed to the deep trench 134. For example, the tin region 114 may have a top surface 114$u$ connected with a portion of the shallow trench 132, and may have a side surface 114$s$ connected with a portion of the deep trench 134. The fin region 114 may protrude in the fourth direction D4 from the top surface 120$u$ of the device isolation layer 120 exposed to the deep trench 134. The top surface 114$u$ of the fin region 114 may be located at a level higher than that of the top surface 120$u$ of the device isolation layer 120. The top surface 114$u$ of the fin region 114 may be located at a level higher than a bottom surface of the deep trench 134. The fin region 114 may be referred to as an active fin region.

The word line structure 200 may be provided in the trench 130. The word line structure 200 may extend in the first direction D1. The word line structure 200 may include a gate insulation pattern 210, a first work function pattern 220, a second work function pattern 230, a gate electrode pattern 240, and a gate capping pattern 250. The word line structure 200 in the shallow trench 132 may be referred to as a first word line structure 202, and the word line structure 200 in the deep trench 134 may be referred to as a second word line structure 204. Thus, the word line structure 200 may continually extend from the shallow trench 132 to the deep trench 134 (see, e.g., FIG. 2A). The first word line structure 202 may vertically overlap the active region 110, and the second word line structure 204 may vertically overlap the device isolation layer 120 (e.g., along the fourth direction D4). The word line structure 200 may include a plurality of word line structures. The plurality of word line structures 200 may be arranged in the second direction D2.

The gate insulation pattern 210 may be provided on the active region 110 and the device isolation layer 120. The gate insulation pattern 210 may extend along an inner surface of the trench 130. The inner surface of the trench 130 may refer to surfaces of the fin region 114 and the device isolation layer 120 that are exposed to the trench 130. For example, the gate insulation pattern 210 may conformally cover the inner surface of the trench 130. The gate insulation pattern 210 may be in direct contact with the active region 110 and the device isolation layer 120.

The gate insulation pattern 210 may be provided on the fin region 114. The gate insulation pattern 210 may substantially cover the top surface 114u and the side surfaces 114s of the fin region 114. For example, the gate insulation pattern 210 may conformally extend along the top surface 114u and the side surfaces 114s of the fin region 114. The gate insulation pattern 210 may include one or more of a high-k dielectric, an oxide, a nitride, or an oxynitride. The high-k dielectric may be an insulating material having a dielectric constant greater than those of oxide and nitride. For example, the high-k dielectric may be a metal oxide (e.g., hafnium oxide or aluminum oxide).

The first work function pattern 220 may be provided on the gate insulation pattern 210. The first work function pattern 220 may extend along the top surface 114u and the side surfaces 114s of the fin region 114 and along the top surface 120u of the device isolation layer 120. For example, the first work function pattern 220 may be conformally disposed on the gate insulation pattern 210. The first work function pattern 220 in the shallow trench 132 may have a thickness substantially the same as that of the first work function pattern 220 in the deep trench 134. The thickness may be a distance between bottom and top surfaces of the first work function pattern 220. The first work function pattern 220 may extend in the first direction D1 along the trench 130. The first work function pattern 220 may fill a lower portion of the trench 130. The top surface of the first work function pattern 220 may be located at a level lower than that of a bottom surface of the gate electrode pattern 240. The first work function pattern 220 may include a material having a work function greater than those of the second work function pattern 230 and the gate electrode pattern 240. For example, the first work function pattern 220 may include p-type polysilicon, molybdenum (Mo), an alloy of molybdenum (Mo), tungsten nitride (WN), or a combination thereof.

The second work function pattern 230 may be provided on the gate insulation pattern 210 and the first work function pattern 220. The second work function pattern 230 may fill a portion of the trench 130. The second work function pattern 230 may extend along an inner side surface of the trench 130 and along the top surface of the first work function pattern 220. The gate insulation pattern 210 may be disposed between the inner side surface of the trench 130 and the second work function pattern 230, and between a floor surface of the trench 130 and the first work function pattern 220. The first work function pattern 220 may be disposed between the floor surface of the trench 130 and the second work function pattern 230. A lowermost portion of the second work function pattern 230 may be spaced apart from the gate insulation pattern 210. The second work function pattern 230 may have a lowermost surface in direct contact with the top surface of the first work function pattern 220. The second work function pattern 230 may extend in the first direction D1.

The second work function pattern 230 may include a material having a work function less than that of the first work function pattern 220. For example, the second work function pattern 230 may include titanium nitride (TiN). The second work function pattern 230 may adjust a threshold voltage.

The gate electrode pattern 240 may be provided on the second work function pattern 230. The gate electrode pattern 240 may fill a portion of the trench 130 (e.g., a portion of the trench 130 not filled by the gate insulation pattern 210, the first work function pattern 220 and the second work function pattern 230 and below the gate capping pattern 250 described below in more detail). The gate insulation pattern 210 and the second work function pattern 230 may be disposed between the gate electrode pattern 240 and the inner side surface of the trench 130. The gate electrode pattern 240 may be spaced apart from the gate insulation pattern 210 by the second work function pattern 230. The gate insulation pattern 210 and the first and second work function patterns 220 and 230 may be disposed between the gate electrode pattern 240 and the floor surface of the trench 130. The gate electrode pattern 240 may be spaced apart from the gate insulation pattern 210 by the first and second work function patterns 220 and 230. The gate electrode pattern 240 may extend in the first direction D1 along the second work function pattern 230.

The gate electrode pattern 240 may include a relatively low resistance material. For example, the gate electrode pattern 240 may include one or more of a doped semiconductor (e.g., doped silicon, or doped germanium), a conductive metal nitride (e.g., titanium nitride, or tantalum nitride), a metal (e.g., tungsten, titanium, or tantalum), or a metal-semiconductor compound (e.g., tungsten silicide, cobalt silicide, or titanium silicide).

The gate capping pattern 250 may fill a remaining portion of the trench 130 (e.g., a portion of the trench 130 not filled by the gate insulation pattern 210, the first work function pattern 220, the second work function pattern 230 and the gate electrode pattern 240). The gate capping pattern 250 may be provided on the second work function pattern 230 and the gate electrode pattern 240. For example, the gate capping pattern 150 may fill a portion of the recess 130 above the second work function pattern 230 and the gate electrode pattern 240). The gate capping pattern 250 may have a top surface substantially coplanar with a top surface of the substrate 100 (e.g., along a direction parallel to an upper surface of the substrate 100). The gate capping pattern 250 may include an insulating material. For example, the gate capping pattern 250 may include silicon oxide, silicon nitride, and/or oxynitride.

Each of the active regions 110 may be provided therein with first source/drain regions 142 and a second source/drain region 144. The first and second source/drain regions 142 and 144 may have substantially a same conductivity as each other. The first and second source/drain regions 142 and 144 may have a different conductivity from that of the active region 110. For example, the active region 110 may have a p-type conductivity, and the first and second source/drain regions 142 and 144 may have an n-type conductivity.

The second source/drain region 144 may be provided in the active region 110 between a pair of word line structures 200 running across one active region 110. In the active region 110, the first source/drain regions 142 may be spaced apart from each other (see, e.g., FIG. 2).

The substrate 100 may be provided thereon with a first interlayer dielectric layer 510, a second interlayer dielectric layer 520, and a protection layer 550 that are sequentially stacked. The first and second interlayer dielectric layers 510 and 520 and the protection layer 550 may each include an insulating material. For example, the first and second interlayer dielectric layers 510 and 520 and the protection layer 550 may include silicon oxide, silicon nitride, and/or oxynitride.

The bit line structure 300 may be provided in the second interlayer dielectric layer 520. The bit line structure 300 may extend in the second direction D2. The bit line structure 300 may include a bit line electrode pattern 310, a bit line capping pattern 320, and a bit line spacer 330. The hit line structure 300 may include a plurality of bit line structures. The plurality of bit line structures 300 may be arranged in the first direction D1.

The bit line electrode pattern 310 may include a conductive material. For example, the hit line electrode pattern. 310 may include one or more of a doped semiconductor (e.g., doped silicon, or doped germanium), a conductive metal nitride (e.g., titanium nitride, or tantalum nitride), a metal (e.g., tungsten, titanium, or tantalum), or a metal-semiconductor compound (e.g., tungsten silicide, cobalt silicide, or titanium silicide).

The bit line capping pattern 320 may be provided on the bit line electrode pattern 310 and may cover a top surface of the hit line electrode pattern 310. The bit line capping pattern 320 may include an insulating material. For example, the bit line capping pattern 320 may include silicon oxide, silicon nitride, and/or silicon oxynitride.

The bit line spacer 330 may be provided on a side surface of the bit line electrode pattern 310 and a side surface of the bit line capping pattern 320 directly adjacent to the bit line electrode pattern 310. The bit line spacer 330 may include an insulating material. For example, the bit line spacer 330 may include silicon oxide, silicon nitride, and/or silicon oxynitride.

A first contact 530 may be provided in the first interlayer dielectric layer 510. The first contact 530 may electrically connect the bit line electrode pattern 310 and the second source/drain region 144 to each other. The first contact 530 may include a conductive material. For example, the first contact 530 may include one or more of a doped semiconductor (e.g., doped silicon, or doped germanium), a conductive metal nitride (e.g., titanium nitride, or tantalum nitride), a metal (e.g., tungsten, titanium, or tantalum), or a metal-semiconductor compound (e.g., tungsten silicide, cobalt silicide, or titanium silicide).

The data storage elements 400 may be provided on the protection layer 550. The data storage elements 400 may is not limited to a particular shape, and may have various shapes, as desired). For example, each of the data storage elements 400 may be a capacitor. The capacitor may include a bottom electrode, a dielectric layer, and a top electrode. Second contacts 540 may penetrate the first and second interlayer dielectric layers 510 and 520 and the protection layer 550 and may thus electrically connect the data storage elements 400 to the first source/drain regions 142. The second contact 540 may include a conductive material. For example, the second contact 540 may include one or more of a doped semiconductor (e.g., doped silicon, or doped germanium), a conductive metal nitride (e.g., titanium nitride, or tantalum nitride), a metal (e.g., tungsten, titanium, or tantalum), or a metal-semiconductor compound (e.g., tungsten silicide, cobalt silicide, or titanium silicide).

According to an exemplary embodiment of the present inventive concept, the first work function pattern 220 may have a work function greater than that of the gate electrode pattern 240. The first work function pattern 220 may cause a channel to have an increased threshold voltage to prevent leakage current flowing through the channel. The prevention of leakage current may increase accuracy of desired electrical conductivity of semiconductor devices (e.g., may increase electrical conductivity of semiconductor devices).

Referring to FIGS. 1, 2A and 2B, according to another exemplary embodiment of the present inventive concept, a semiconductor device may include the device isolation layer 120 defining the fin region 114. At least one trench (e.g., 132 or 134) may be formed below the upper surface 122 of the device isolation layer 120. The gate insulation pattern 210 may be disposed on side surfaces and an upper surface of the fin region 114. The first work function pattern 220 may be disposed on the gate insulation pattern 210. The second work function pattern 230 is disposed on the first work function pattern 220. The gate electrode pattern 240 may be disposed on the second work function pattern 230. The gate insulation pattern. 210 may be conformally disposed on side surfaces and a bottom surface of the at least one trench (e.g., 132 or 134). The first work function pattern 220 may be disposed on a portion of the gate insulation pattern 210 disposed on the bottom surface of the at least one trench (e.g., 132, or 134). The second work function pattern 230 may be disposed on a portion of the gate insulation pattern 210 disposed on the side surfaces of the at least one trend (e.g., 132 or 134) and on the first work function pattern 220 on the bottom surface of the at least one trench (e.g., 132 or 134). The gate electrode pattern 240 may be disposed on the second work function pattern 230 in the at least one trench (e.g., 132 or 134).

Figure 3A:
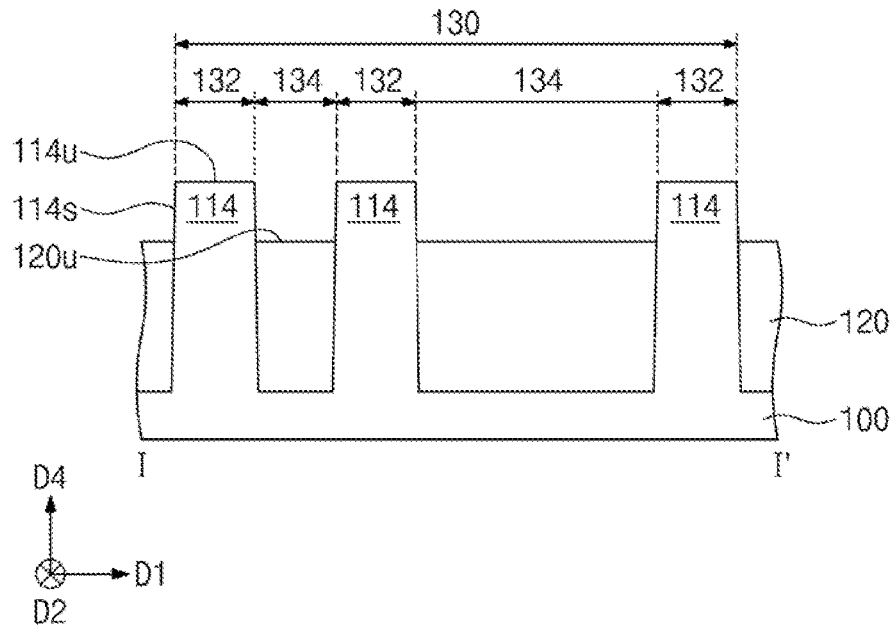
FIGS. 3A, 4A, and 5A illustrate enlarged views corresponding to section AA of FIG. 2, and illustrate a method of manufacturing a semiconductor device according to an exemplary embodiment of the present inventive concept.
Figure 3B:
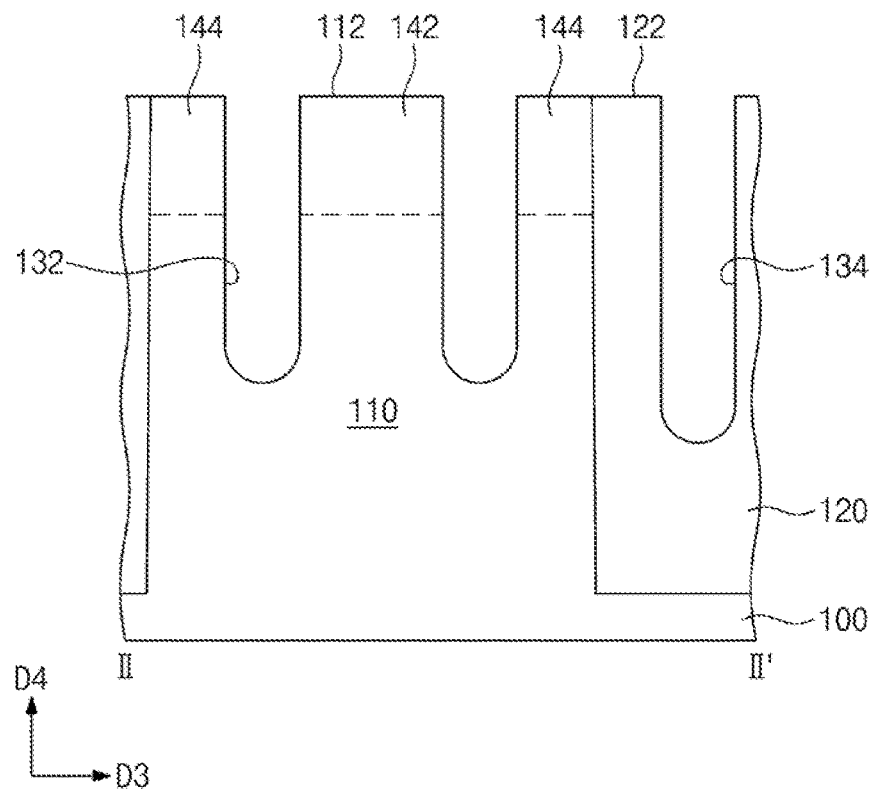
FIGS. 3B, 4B, and 5B illustrate enlarged views corresponding to section BB of FIG. 2, and illustrate a method of manufacturing a semiconductor device according to an exemplary embodiment of the present inventive concept.
Figure 4A:
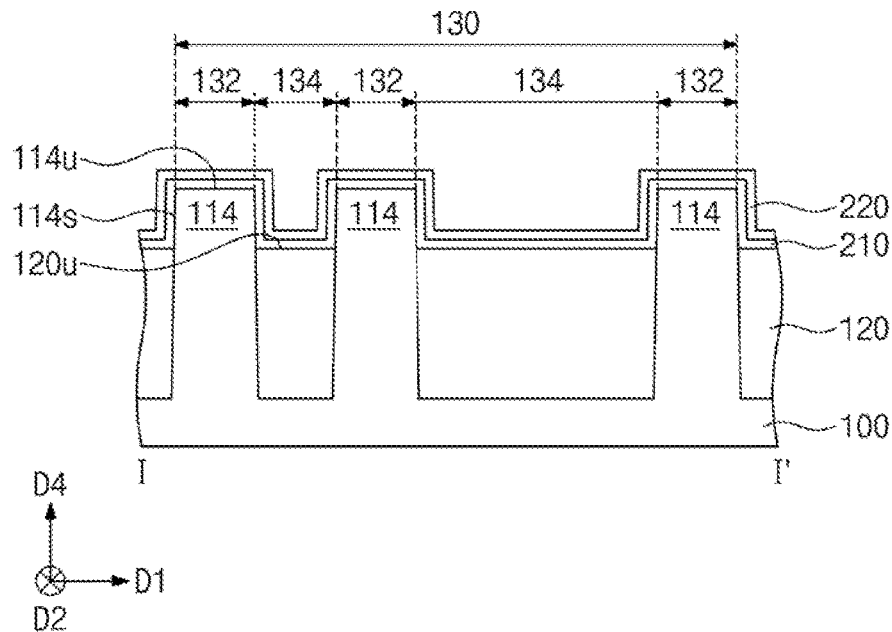
Figure 4B:
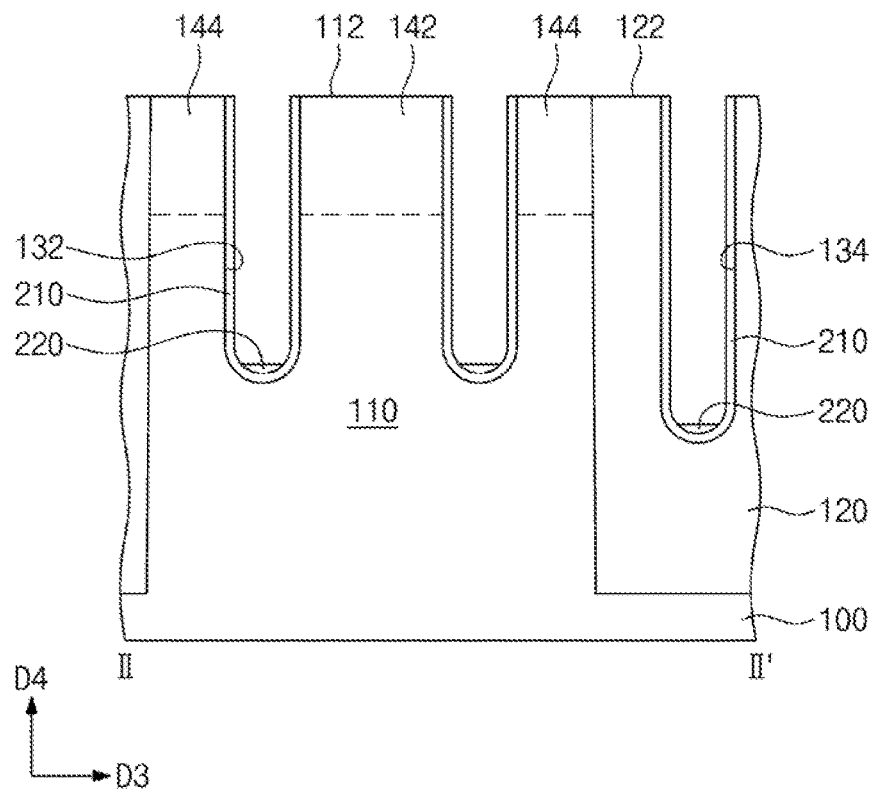
Figure 5A:
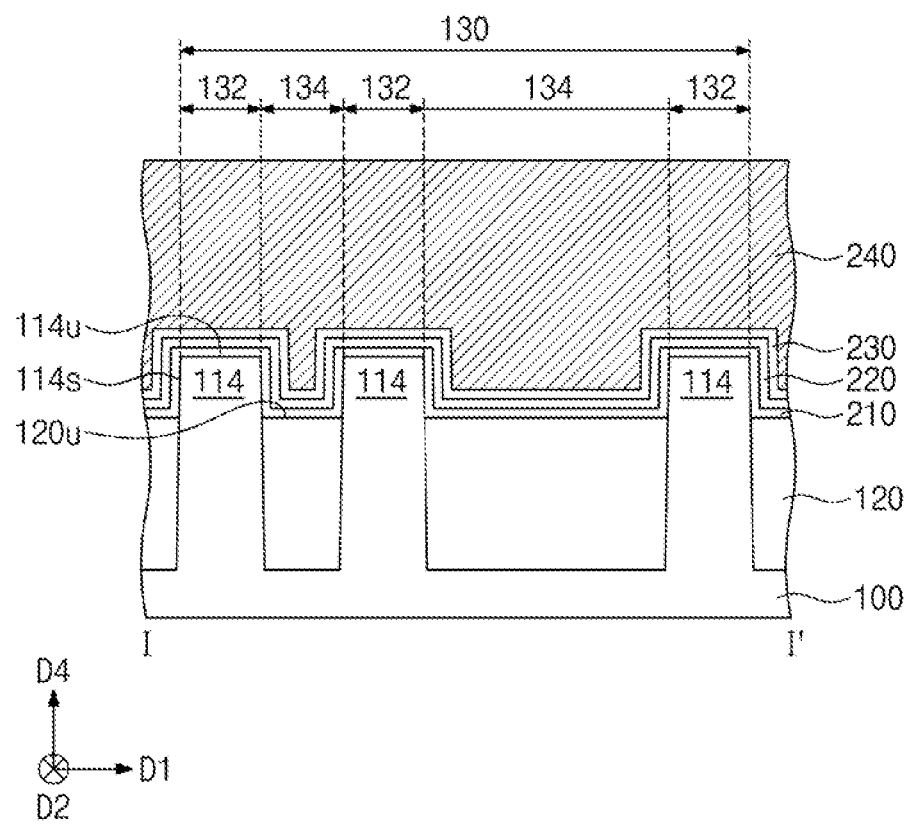
Figure 5B:
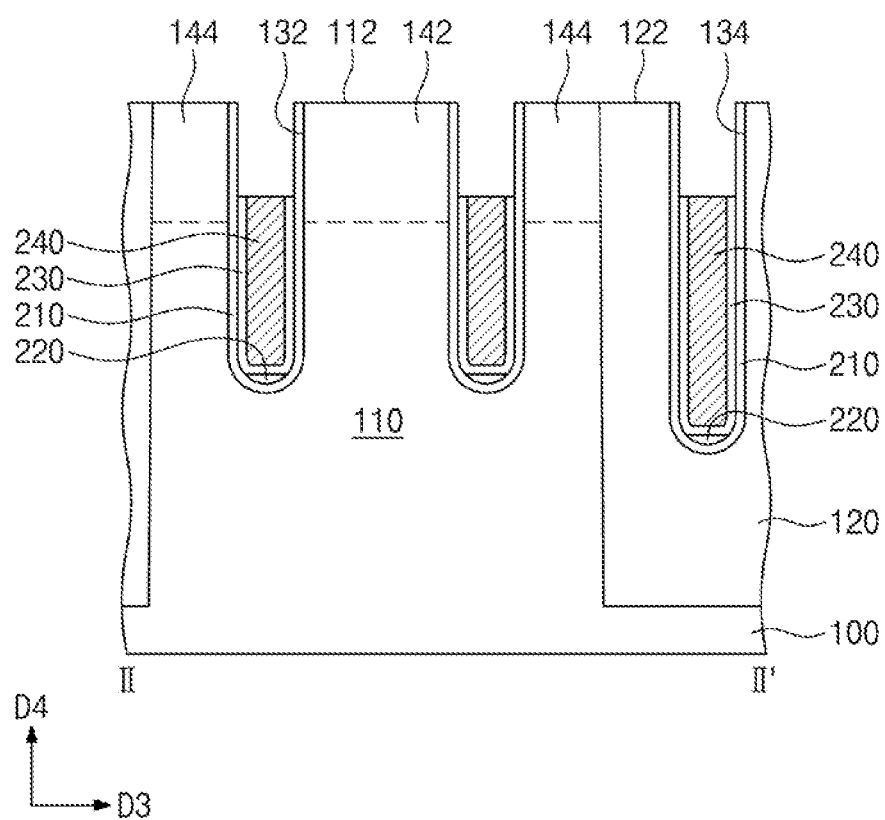

FIGS. 3A, 4A, and 5A illustrate enlarged views corresponding to section AA of FIG. 2, and illustrate a method of manufacturing a semiconductor device according to an exemplary embodiment of the present inventive concept. FIGS. 3B, 4B, and 5B illustrate enlarged views corresponding to section BB of FIG. 2, and illustrate a method of manufacturing a semiconductor device according to an exemplary embodiment of the present inventive concept.

Referring to FIGS. 1, 3A, and 3B, a substrate 100 may be provided. The substrate may include active regions 110. The substrate 100 may include a semiconductor material. For example, the substrate 100 may be a silicon (Si) substrate, a germanium (Ge) substrate, a silicon-germanium (SiGe) substrate, or a compound semiconductor substrate such as a gallium-arsenic (GaAs) substrate.

The formation of the active regions 110 may include forming on the substrate 100 a mask pattern defining the active regions 110 and performing an etching process to etch the substrate 100 using the mask pattern as an etch mask. The mask pattern may vertically overlap the active regions 110 (e.g., along the fourth direction D4). Each of the active regions 110 may be implanted with impurities to form first source/drain regions 142 and the second source/drain region 144.

The device isolation layer 120 may be formed on the substrate 100. The formation of the device isolation layer 120 may include filling an insulating material (e.g., one or more of silicon oxide, silicon nitride, or silicon oxynitride) into an area where the substrate 100 is removed when the etching process is performed.

The trench 130 may be formed in the active regions 110 and the device isolation layer 120. The formation of the trench 130 may include forming a mask pattern on the active regions 110 and the device isolation layer 120, and then performing an etching process to etch the active regions 110 and the device isolation layer 120 using the mask pattern as an etch mask. When the etching process is performed, the device isolation layer 120 may be etched deeper than the active regions 110 (e.g., along the fourth direction D4). This step may form the shallow trench 132 recessing the active regions 110 and the deep trench 134 recessing the device isolation layer 120. The shallow trench 132 may have a depth less than that of the deep trench 134 (e.g., along the fourth direction D4). The deep trench 134 may expose a side surface of the active region 110.

Referring to FIGS. 4A and 4B, a gate insulation pattern 210 may be formed in the trench 130. The formation of the gate insulation pattern 210 may include performing chemical vapor deposition (CVD), atomic layer deposition (ALD), thermal oxidation, plasma oxidation, or a combination thereof to deposit an insulating material on the active region 110 and the device isolation layer 120, and then removing the insulating material provided on an uppermost top surface of the active region 110 and an uppermost top surface of the device isolation layer 120. The gate insulation pattern 210 may include one or more of high-k dielectric, oxide, nitride, or oxynitride. The high-k dielectric may be an insulating material having a dielectric constant greater than that of silicon oxide. For example, the high-k dielectric may be metal oxide (e.g., hafnium oxide and aluminum oxide).

The first work function pattern 220 may be formed in a lower portion of the trench 130. The formation of the first work function pattern 220 may include forming on the active region 110 and the device isolation layer 120 a first work function layer to fill a lower portion of the trench 130, and then performing an etch-back process on the first work function layer to partially remove the first work function layer. The removal of the first work function layer may be performed until exposing the gate insulation pattern 210 on an inner side surface of the trench 130. A remainder of the first work function layer may remain in the lower portion of the trench 130. The remainder of the first work function layer may be referred to as the first work function pattern 220. The first work function pattern 220 may include a material having a work function greater than that of a gate electrode pattern 240 which is discussed in more detail below. For example, the first work function pattern 220 may include p-type polysilicon, molybdenum (Mo), an alloy of molybdenum (Mo), tungsten nitride (WN), or a combination thereof.

Referring to FIGS. 5A and 5B, the second work function pattern 230 and the gate electrode pattern 240 may be formed on the first work function pattern 220. The formation of the second work function pattern 230 and the gate electrode pattern 240 may include sequentially depositing a second work function layer and a gate electrode layer on the active region 110 and the device isolation layer 120, and then performing an etch-back process on the second work function layer and the gate electrode layer to partially remove the second work function layer and the gate electrode layer. The removal of the second work function layer and the gate electrode layer may be executed until exposing the top surface 112 of the active region 110, the top surface 122 of the device isolation layer 120, and an upper portion of the inner side surface of the trench 130. A remainder of the second work function layer may substantially cover top surfaces of the first work function pattern 220 and the gate insulation pattern 210. The remainder of the second work function layer may be referred to as the second work function pattern 230. A remainder of the gate electrode layer may fill an area defined by the second work function pattern 230. The remainder of the gate electrode layer may be referred to as the gate electrode pattern 240. The second work function pattern 230 may include a material having a work function less than that of the first work function pattern 220. For example, the second work function pattern 230 may include titanium nitride (TiN), tantalum nitride (TaN), tungsten nitride (WN), or a combination thereof. The gate electrode pattern 240 may include a conductive material. For example, the gate electrode pattern 240 may include one or more of a doped semiconductor (e.g., doped silicon, or doped germanium), a conductive metal nitride (e.g., titanium nitride, or tantalum nitride), a metal (e.g., tungsten, titanium, or tantalum), or a metal-semiconductor compound (e.g., tungsten silicide, cobalt silicide, or titanium silicide).

Referring back to FIGS. 1, 2, 2A, and 2B, the gate capping pattern 250 may be formed in an upper portion of the trench 130. The gate capping pattern 250 may be formed on the second work function pattern 230 and the gate electrode pattern 240. The formation of the gate capping pattern 250 may include forming on the active region 110 and the device isolation layer 120 a gate capping layer to fill the trench 130, and then partially removing the gate capping layer to expose the top surface 112 of the active region 110 and the top surface 122 of the device isolation layer 120. The gate capping pattern 250 may include an insulating material. For example, the gate capping pattern 250 may include one or more of silicon oxide, silicon nitride, or silicon oxynitride.

The first interlayer dielectric layer 510 may be deposited on the active region 110 and the device isolation layer 120, and then the first contact 530 may be formed to penetrate the first interlayer dielectric layer 510. The formation of the first contact 530 may include forming a first contact hole to penetrate the first interlayer dielectric layer 510 and filling the first contact hole with a conductive material.

The bit line structure 300 may be formed on the first contact 530. The bit line structure 300 may include the bit line electrode pattern 310, the bit line capping pattern 320, and the bit line spacer 330. The formation of the bit line electrode pattern 310 and the bit line capping pattern 320 may include sequentially depositing a bit line electrode layer and a bit line capping layer on the first contact 530 and the first interlayer dielectric layer 510, and sequentially partially etching the bit line capping layer and the bit line electrode layer. A bit line spacer layer may be formed to cover surfaces of the first interlayer dielectric layer 510, the bit line electrode pattern 310, and the bit line capping pattern 320, and then anisotropically etching the bit line spacer layer to form the bit line spacer 330.

The second interlayer dielectric layer 520 and the protection layer 550 may be formed on the first interlayer dielectric layer 510. The second interlayer dielectric layer 520 and the protection layer 550 may cover side and top surfaces of the bit line structure 300. The formation of the second interlayer dielectric layer 520 and the protection layer 550 may include performing a deposition process to deposit an insulating material on the first interlayer dielectric layer 510 and the bit line structure 300. The first and second interlayer dielectric layers 510 and 520 and the protection layer 550 may include one or more of silicon oxide, silicon nitride, or oxynitride.

The second contact 540 may be formed in the first and second interlayer dielectric layers 510 and 520. The formation of the second contact 540 may include etching the first and second interlayer dielectric layers 510 and 520 to form a second contact hole and filling the second contact hole with a conductive material. The first and second contacts 530 and 540 may include a conductive material. For example, the first and second contacts 530 and 540 may include one or more of a doped semiconductor (e.g., doped silicon, or doped germanium), a conductive metal nitride (e.g., titanium nitride, or tantalum nitride), a metal (e.g., tungsten, titanium, or tantalum), or a metal-semiconductor compound (e.g., tungsten silicide, cobalt silicide, or titanium silicide).

The data storage element 400 may be formed on the second contact 540. The data storage element 400 may be electrically connected to the second contact 540. For example, the data storage element 400 may be a capacitor.

Figure 6A:
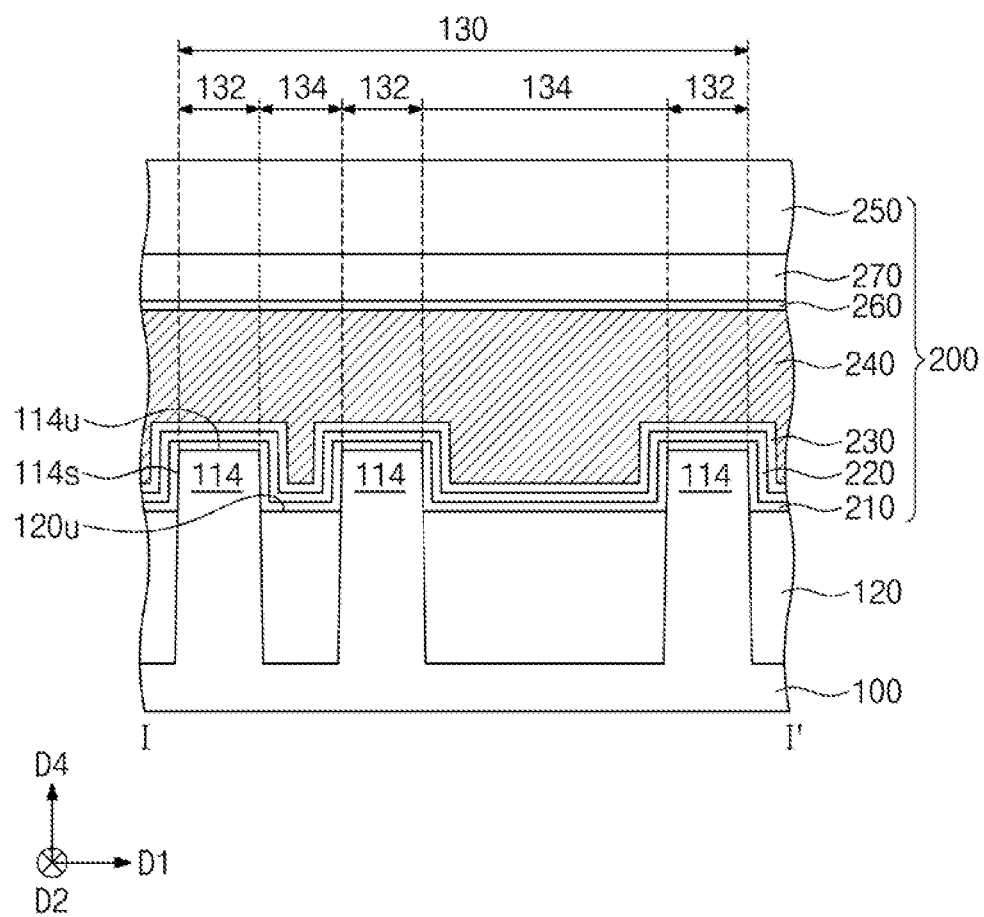
FIG. 6A illustrates an enlarged view corresponding to section AA of FIG. 2, and illustrates a semiconductor device according to an exemplary embodiment of the present inventive concept.
Figure 6B:
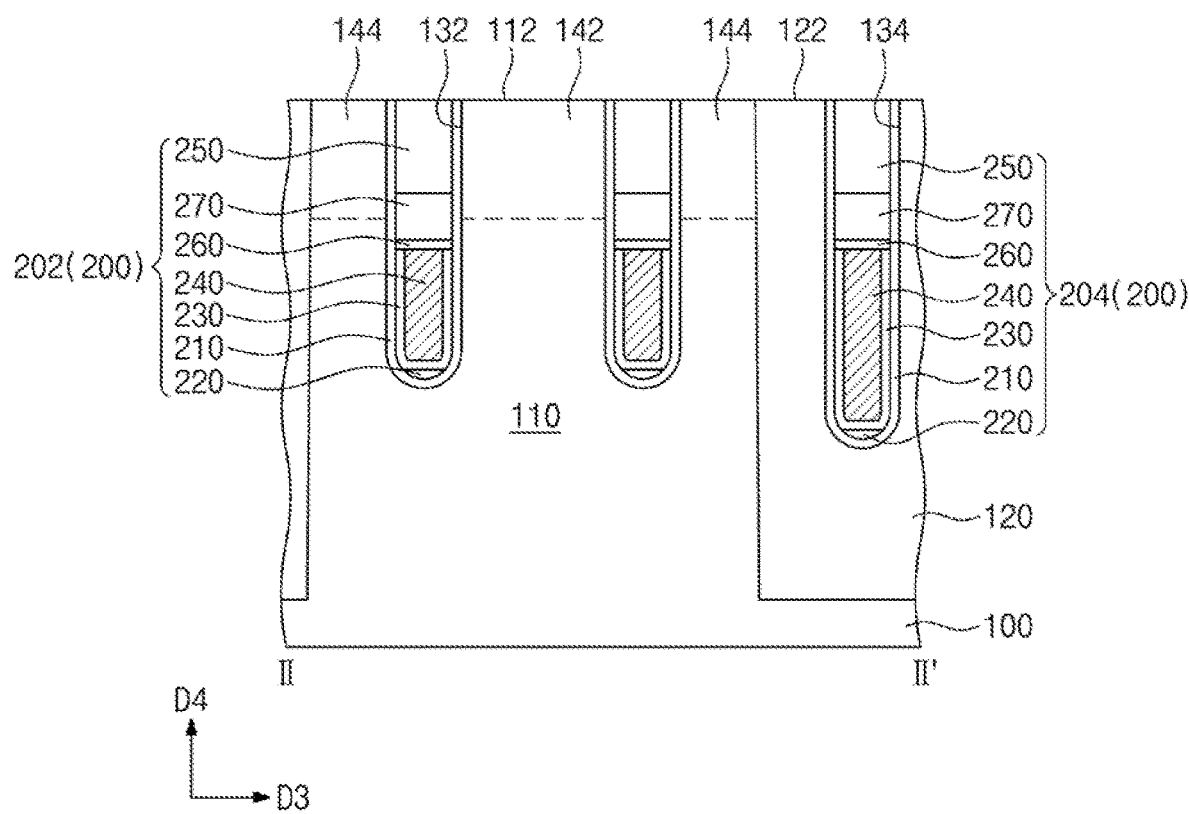
FIG. 6B illustrates an enlarged view corresponding to section BB of FIG. 2, and illustrates a semiconductor device according to an exemplary embodiment of the present inventive concept.

FIG. 6A illustrates an enlarged view corresponding to section AA of FIG. 2, and illustrates a semiconductor device according to an exemplary embodiment of the present inventive concepts. FIG. 6B illustrates an enlarged view corresponding to section BB of FIG. 2, and illustrates a semiconductor device according to an exemplary embodiment of the present inventive concept. Descriptions of components that are the same or substantially the same as those discussed above with reference to FIGS. 1 to 5B may be omitted below.

Referring to FIGS. 1, 2, 6A, and 6B, each of the first and second word line structures 202 and 204 may further include a barrier pattern 260 and a third work function pattern 270. The barrier pattern 260 and the third work function pattern 270 may be sequentially stacked between the gate capping pattern 250 and the gate electrode pattern 240 and between the gate capping pattern 250 and the second work function pattern 230. The barrier pattern 260 and the third work function pattern 270 may extend in the first direction D1.

The barrier pattern 260 may be provided on the second work function pattern 230 and the gate electrode pattern 240. The barrier pattern 260 may substantially cover an uppermost top surface of the second work function pattern 230 and a top surface of the gate electrode pattern 240. The barrier pattern 260 may prevent the third work function pattern 270 from receiving a material (e.g. tungsten (W)) diffused from the gate electrode pattern 240. For example, the barrier pattern 260 may include titanium nitride (e.g., TiN).

The third work function pattern 270 may include a material having a work function less than those of the first and second work function patterns 220 and 230. For example, the third work function pattern 270 may include n-type, polysilicon. The third work function pattern 270 may prevent field concentration between the gate electrode pattern 240 and one or both of the first and second source/drain regions 142 and 144, thus blocking or reducing gate induced drain leakage.

The gate insulation pattern 210 may be disposed between the barrier pattern 260 and the inner side surface of the trench 130 and between the third work function pattern 270 and the inner side surface of the trench 130. The gate insulation pattern 210 may be disposed between the gate capping pattern 250 and the device isolation layer 120.

According to an exemplary embodiment of the present inventive concept, the gate induced drain leakage may be blocked or reduced to cause a semiconductor device to have desired electrical conductivity with increased accuracy.

A method of forming the barrier pattern 260 and the third work function pattern 270 will be described in more detail below.

The formation of the barrier pattern 260 may include forming the second work function pattern 230 and the gate electrode pattern 240 (see, e.g., FIGS. 5A and 5B), depositing a barrier layer on the active region 110 and the device isolation layer 120, and then performing an etch-back process on the barrier layer to partially remove the barrier layer. A remainder of the barrier layer may remain on the second work function pattern 230 and the gate electrode pattern 240. The remainder of the barrier layer may be referred to as the barrier pattern 260.

The formation of the third work function pattern 270 may include depositing a third work function layer on the active region 110 and the device isolation layer 120 and performing an etch-back process on the third work function layer to partially remove the third work function layer. A remainder of the third work function layer may remain on the barrier pattern 260. The remainder of the third work function layer may be referred to as the third work function pattern 270.

According to an exemplary embodiment of the present inventive concept, the third work function pattern 270 may block or reduce gate induced drain leakage, and the first work function pattern 220 may increase a threshold voltage of a channel to prevent leakage current flowing through the channel. Accordingly, the prevention of leakage current may increase accuracy of desired electrical conductivity of semiconductor devices.

Figure 7A:
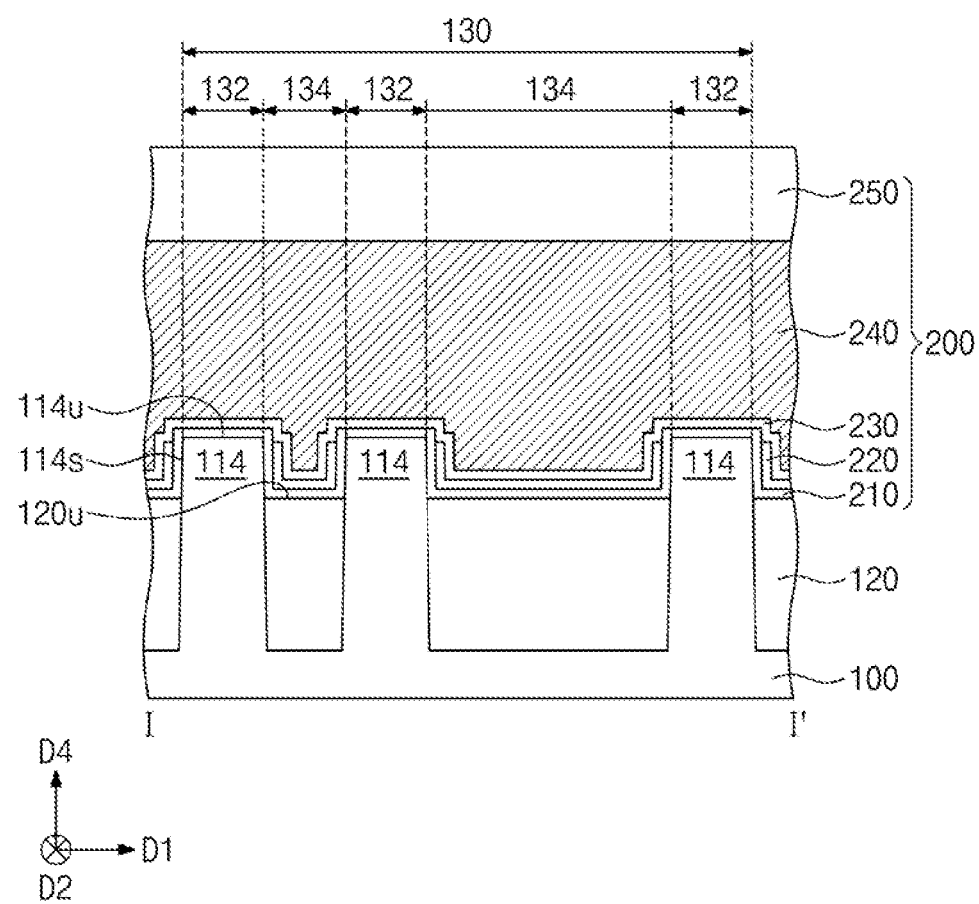
FIG. 7A illustrates an enlarged view corresponding to section AA of FIG. 2, and illustrates a semiconductor device according to an exemplary embodiment of the present inventive concept.
Figure 7B:
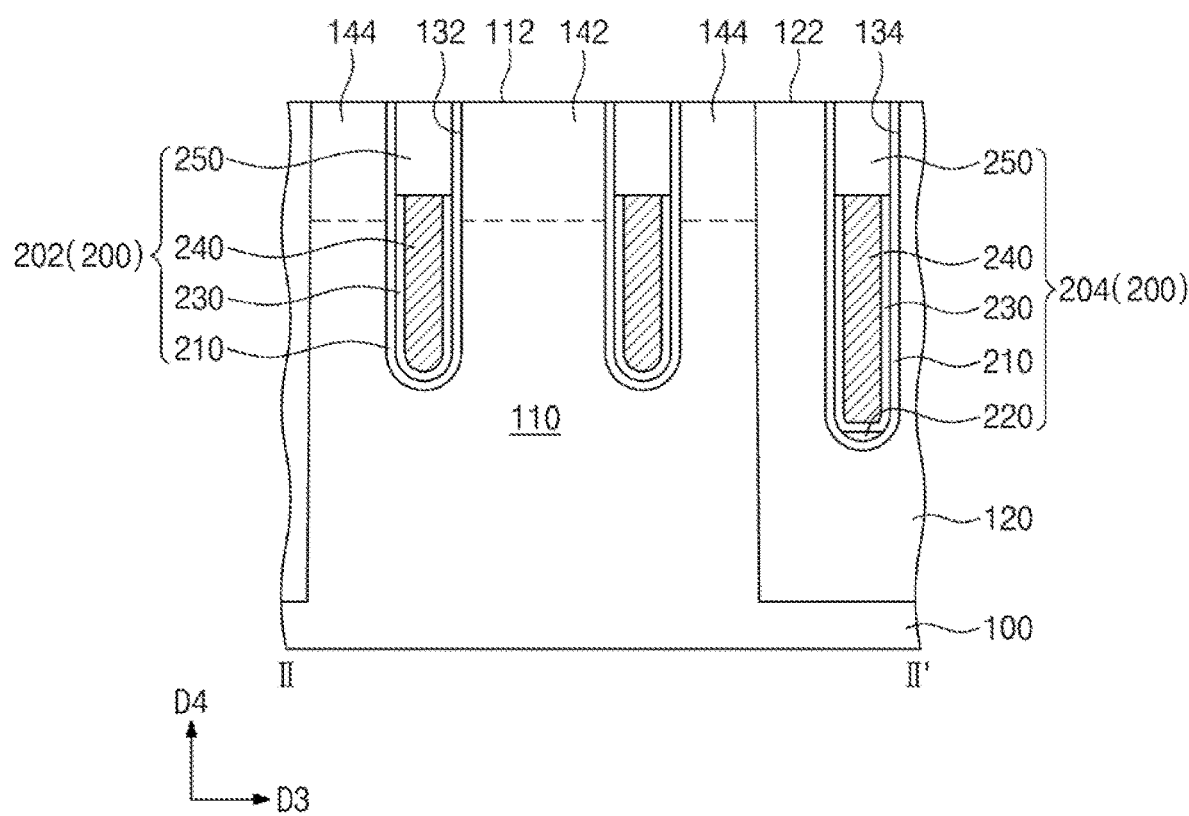
FIG. 7B illustrates an enlarged view corresponding to section BB of FIG. 2, and illustrates a semiconductor device according to an exemplary embodiment of the present inventive concept.

FIG. 7A illustrates an enlarged view corresponding to section AA of FIG. 2, and illustrates a semiconductor device according to an exemplary embodiment of the present inventive concept. FIG. 7B illustrates an enlarged view corresponding to section BB of FIG. 2, and illustrates a semiconductor device according to an exemplary embodiment of the present inventive concept. Descriptions of components that are the same or substantially the same as those discussed above with reference to FIGS. 1 to 5B may be omitted below.

Referring to FIGS. 1, 2, 7A, and 7B, the first work function pattern 220 need not be provided on the top surface 114*u* of the fin region 114. For example, the first work function pattern 220 need not be provided in a lower portion of the shallow trench 132. The word line structure 200 may include the gate insulation pattern 210, the second work function pattern 230, the gate electrode pattern 240, and the gate capping pattern 250 that fill the shallow and deep trenches 132 and 134, and may further include the first work function pattern 220 locally provided in the deep trench 134. The first word line structure 202 need not include the first work function pattern 220. The second work function pattern 230 and the gate insulation pattern 210 may be in direct contact with each other either on the fin region 114 or in a lower portion of the shallow trench 132.

The first work function pattern 220 may be provided on the side surface 114*s* of the fin region 114 and the top surface 120*u* of the device isolation layer 120. For example, the second word line structure 204 may include the first work function pattern 220. The first work function pattern 220 may be provided in a lower portion of the deep trench 134. The first work function pattern 220 may fill the lower portion of the deep trench 134. The gate insulation pattern 210, the first work function pattern 220, and the second work function pattern 230 may be sequentially provided on the side surface 114*s* of the fin region 114. In the deep trench 134, the first work function pattern 220 may extend along the side surface 114*s* of the fin region 114 and the top surface 120*u* of the device isolation layer 120. For example, the first work function pattern 220 may horizontally extend along the top surface 120*u* of the device isolation layer 120, and may vertically extend on the side surface 114*s* of the fin region 114. The first work function pattern 220 may include a plurality of first work function patterns. The plurality of first work function patterns 220 may be arranged along the first direction D1. A pair of first work function patterns 220 directly adjacent to each other may be spaced apart from each other along the first direction D1 across the fin region 114.

In an exemplary embodiment of the present inventive concept, the word line structure 200 may further include the barrier pattern and the third work function pattern discussed in more detail above with reference to FIGS. 6A and 6B. The barrier pattern and the third work function pattern may be provided between the gate capping pattern 250 and the gate electrode pattern 240, and may extend between the gate capping pattern 250 and the second work function pattern 230.

In an exemplary embodiment of the present inventive concept, the formation of the first work function pattern 220 may include, when removing the first work function layer discussed in more detail above with reference to FIGS. 4A and 4B, substantially simultaneously removing the first work function layer provided on the top surface 114u of the fin region 114. For example, an anisotropic etching process may be performed to remove the first work function layer on the top surface 114u of the fin region 114.

According to an exemplary embodiment of the present inventive concept, the first to third work function patterns may block or reduce gate induced junction leakage and gate induced drain leakage, thus increasing accuracy of desired electrical conductivity of semiconductor devices.

Figure 8A:
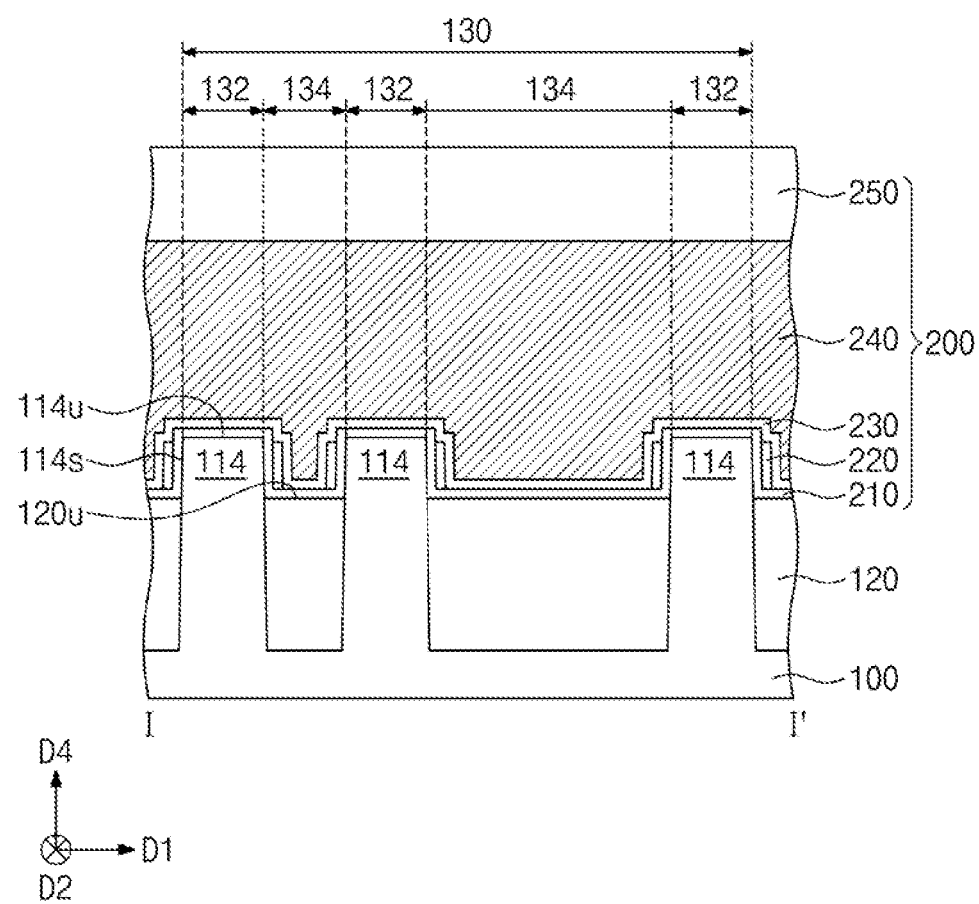
FIG. 8A illustrates an enlarged view corresponding to section AA of FIG. 2, and illustrates a semiconductor device according to an exemplary embodiment of the present inventive concept.
Figure 8B:
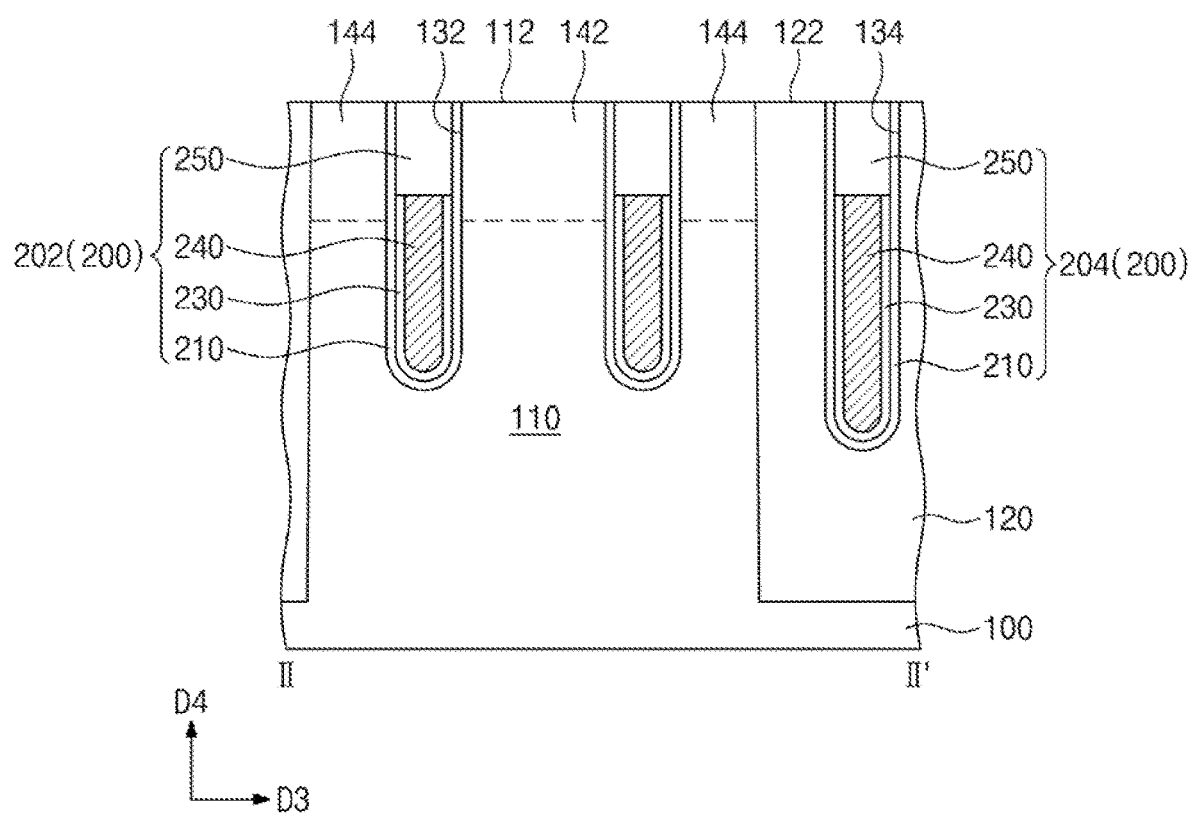
FIG. 8B illustrates an enlarged view corresponding to section BB of FIG. 2, and illustrates a semiconductor device according to an exemplary embodiment of the present inventive concept.

FIG. 8A illustrates an enlarged view corresponding to section AA of FIG. 2, and illustrates a semiconductor device according to an exemplary embodiment of the present inventive concept, FIG. 8B illustrates an enlarged view corresponding to section BB of FIG. 2, and illustrates a semiconductor device according to an exemplary embodiment of the present inventive concept. Descriptions of components that are the same or substantially the same as those discussed above with reference to FIGS. 1 to 5B, and 7A, and 7B may be omitted below.

Referring to FIGS. 1, 2, 8A, and 8B, the first work function pattern 220 need not be provided on the top surface 120u of the device isolation layer 120. The gate insulation pattern 210 and the second work function pattern 230 may be sequentially stacked on the top surface 120u of the device isolation layer 120. The second work function pattern 230 and the gate insulation pattern 210 may be in direct contact with each other either on the top surface 120u of the device isolation layer 120 or in a lower portion of the deep trench 134. Referring to FIG. 8B, each of the first and second word line structures 202 and 204 need not include the first work function pattern 220. Referring to FIG. 8A, the second word line structure 204 may include the first work function pattern 220 at an area directly adjacent to the side surface 114s of the fin region 114. The first work function pattern 220 may vertically extend (e.g., along the fourth direction D4). The first work function pattern 220 may be provided in a pair spaced apart from each other along the first direction D1 in the deep trench 134. The pair of first work function patterns 220 may be correspondingly provided on facing side surfaces 114s of a pair of fin regions 114 directly adjacent to the deep trench 134. The gate insulation pattern 210, the first work function pattern 220, and the second work function pattern 230 may be sequentially stacked on the top surface 114u of the fin region 114.

In an exemplary embodiment of the present inventive concept, the word line structure 200 may further include the barrier pattern and the third work function pattern discussed in more detail above with reference to FIGS. 6A and 6B. The barrier pattern and the third work function pattern may be provided between the gate capping pattern 250 and the gate electrode pattern 240, and may extend between the gate capping pattern 250 and the second work function pattern 230.

In an exemplary embodiment of the present inventive concept, the formation of the first work function pattern 220 may include, when removing the first work function layer discussed in more detail above with reference to FIGS. 4A and 4B, substantially simultaneously removing the first work function layer provided on the top surface 114u of the fin region 114 and the top surface 120u of the device isolation layer 120. For example, an anisotropic etching process may be performed to remove the first work function layer on the top surface 114u of the fin region 114 and the top surface 120u of the device isolation layer 120.

According to an exemplary embodiment of the present inventive concept, gate induced junction leakage and gate induced drain leakage may be blocked or reduced, thus increasing accuracy of desired electrical conductivity of semiconductor devices.

Figure 9:
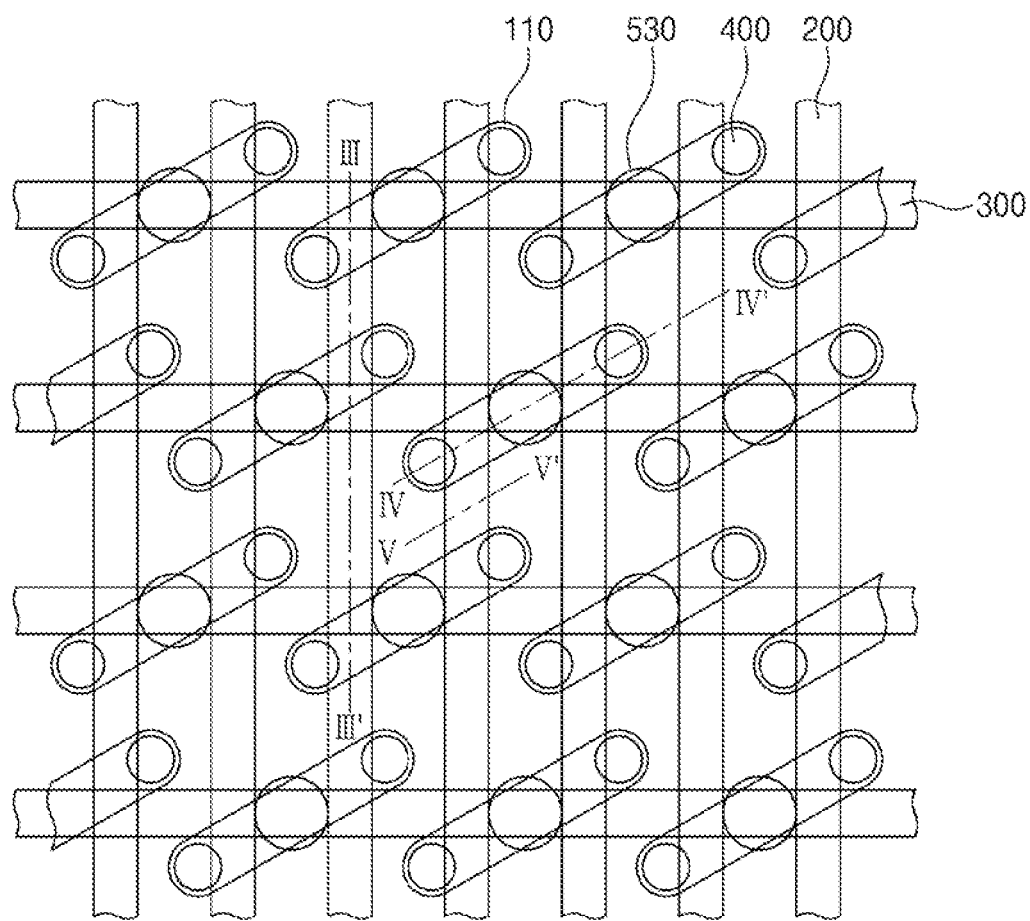
FIG. 9 illustrates a plan view of a semiconductor device according to an exemplary embodiment of the present inventive concept.
Figure 10:
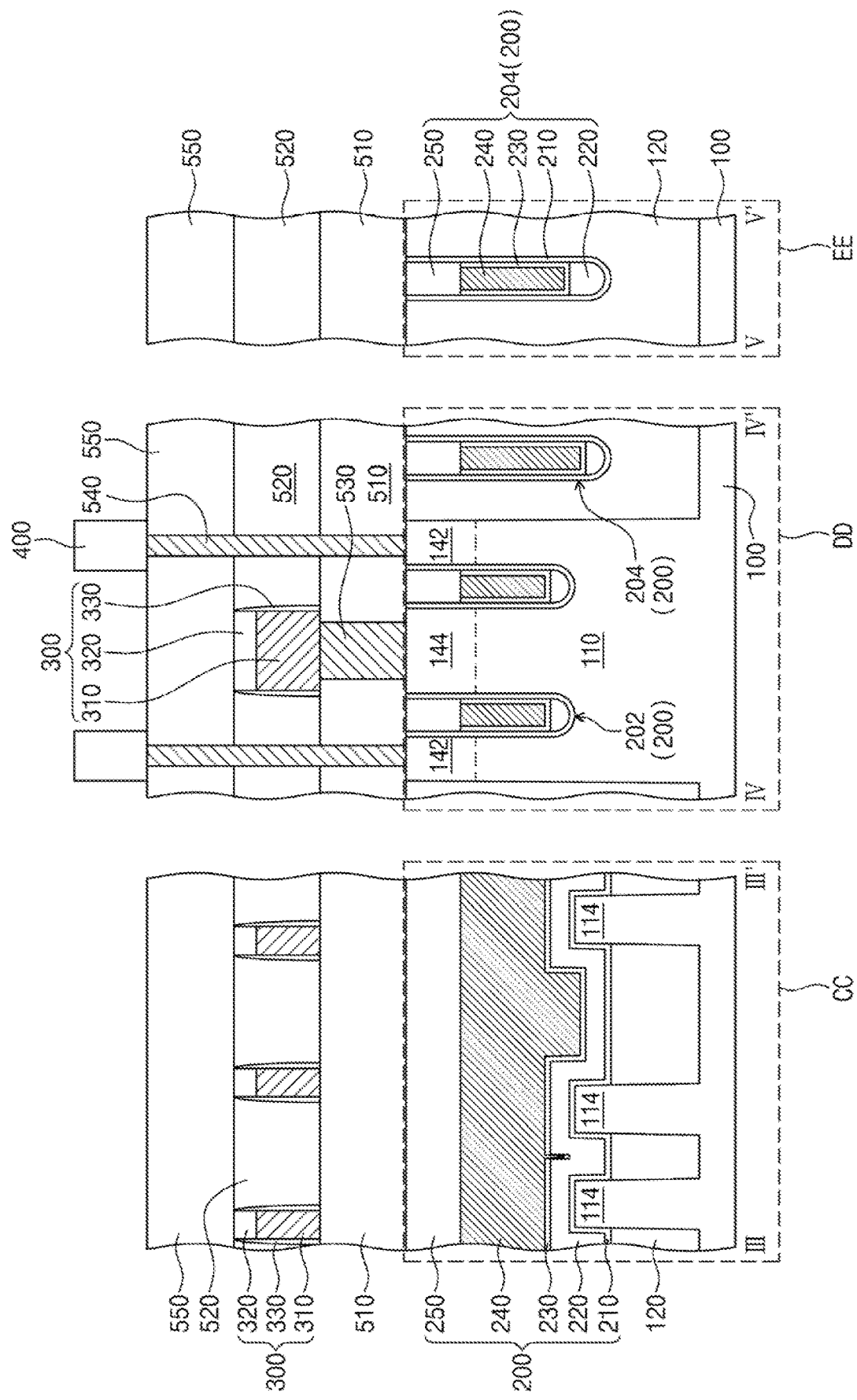
FIG. 10 illustrates a cross-sectional view taken along lines III-III', IV-IV', and V-V' of FIG. 9.
Figure 11A:
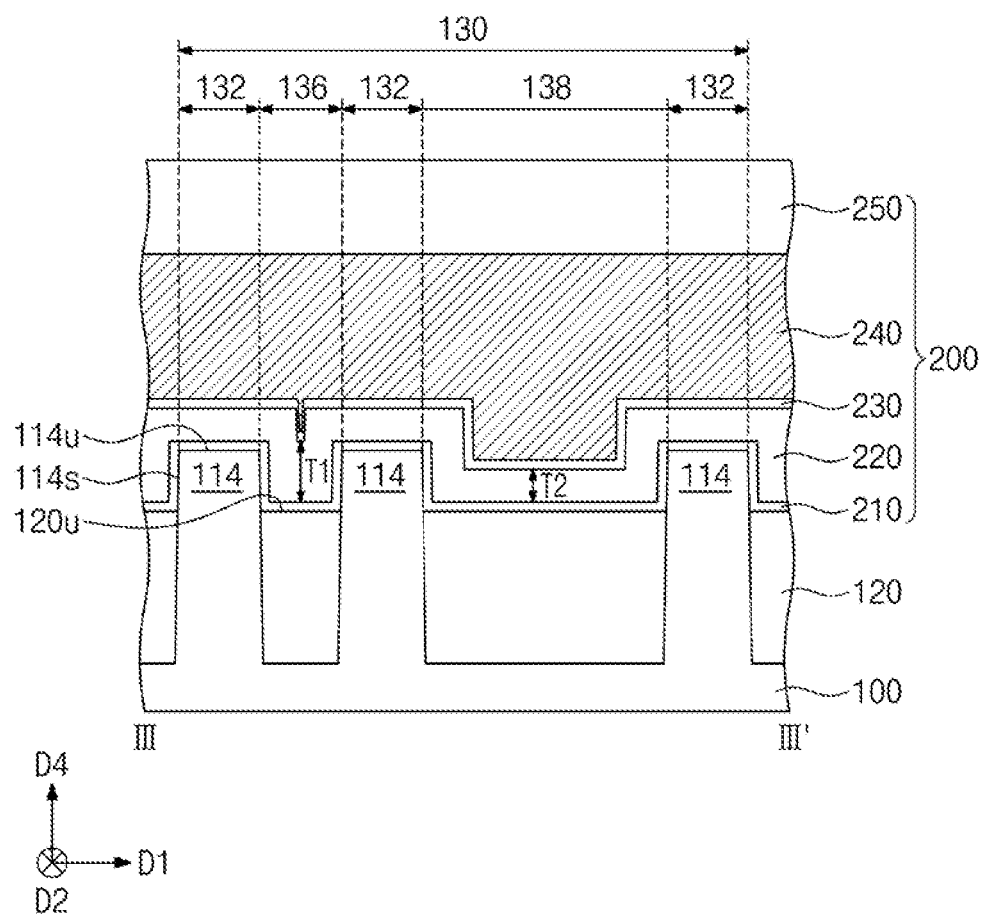
FIG. 11A illustrates an enlarged view of section CC of FIG. 10.
Figure 11B:
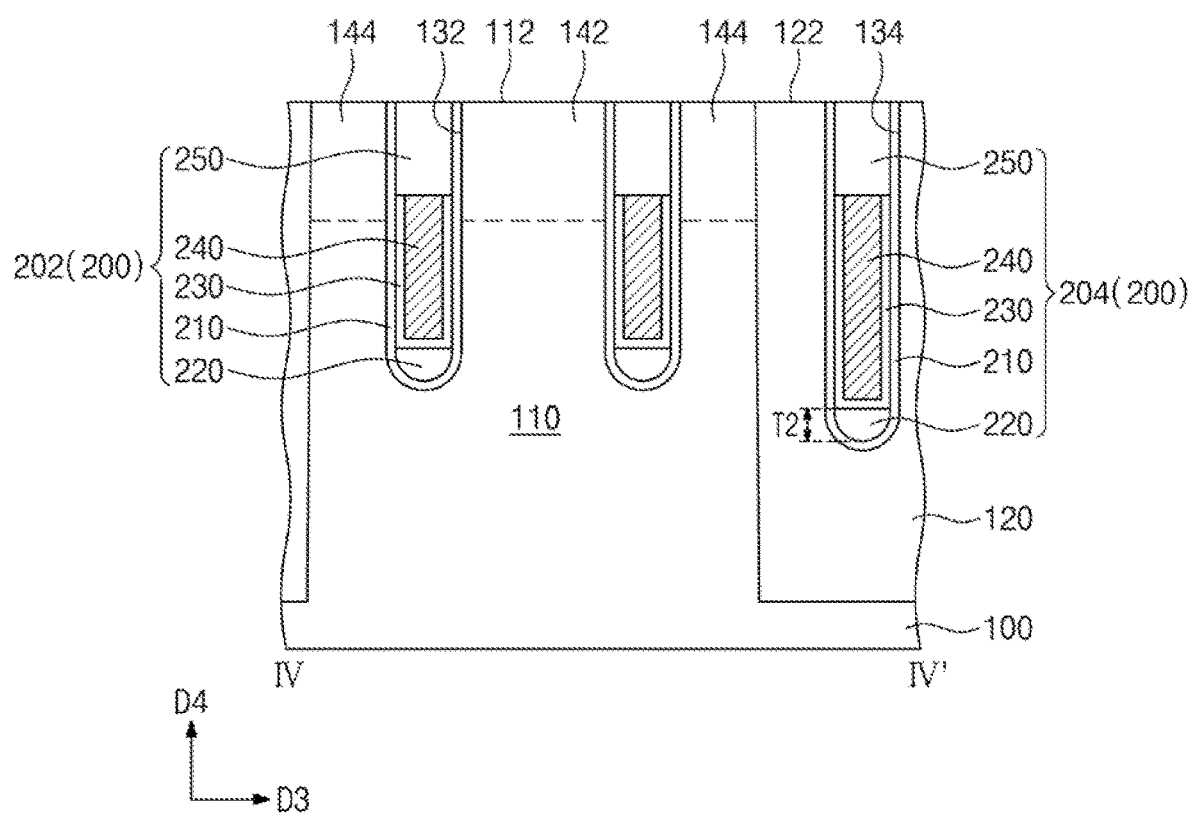
FIG. 11B illustrates an enlarged view of section DD of FIG. 10.
Figure 11C:
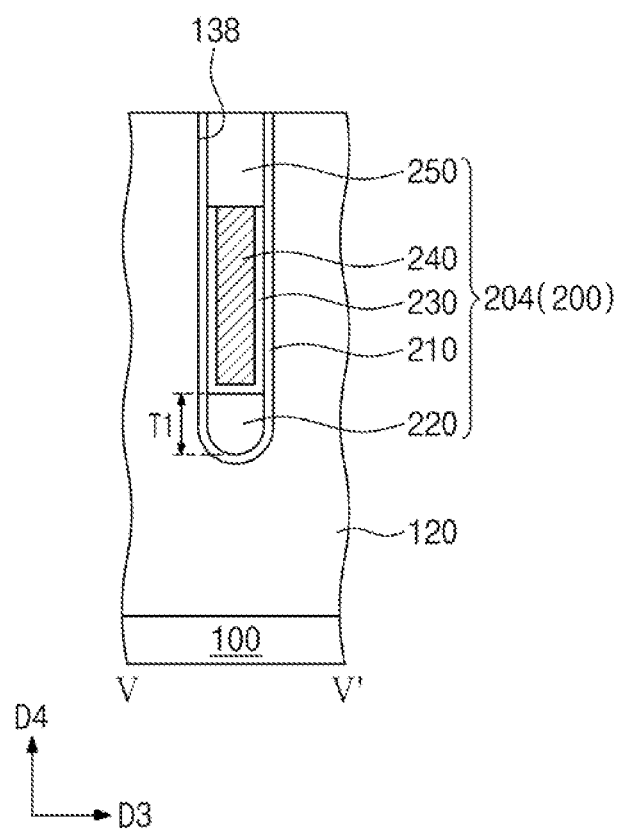
FIG. 11C illustrates an enlarged view of section EE of FIG. 10.

FIG. 9 illustrates a plan view of a semiconductor device according to an exemplary embodiment of the present inventive concept. FIG. 10 illustrates a cross-sectional view taken along lines III-III', IV-IV', and V-V' of FIG. 9. FIG. 11A illustrates an enlarged view of section CC of FIG. 10. FIG. 11B illustrates an enlarged view of section DD of FIG. 10. FIG. 11C illustrates an enlarged view of section EE of FIG. 10. Descriptions of components that are the same or substantially the same as those discussed above with reference to FIGS. 1 to 5B may be omitted below.

Referring to FIGS. 9, 10, 11A, 11B, and 11C, the deep trench 134 may include a first deep trench 136 and a second deep trench 138 having a width greater than that of the first deep trench 136. The width may be a distance between facing side surfaces 114s of the fin regions 114 directly adjacent to each other along the first direction D1. The first deep trench 136 may be the deep trench 134 between a pair of fin regions 114 relatively close to each other, and the second deep trench 138 may be the deep trench 134 between a pair of fin regions 114 relatively distant from each other.

The first work function pattern 220 may be provided in the first and second deep trenches 136 and 138. In the first deep trench 136, the first work function pattern 220 may substantially fill an area defined by the side surface 114s of the fin regions 114 and the top surface 120u of the device isolation layer 120.

In the second deep trench 138, the first work function pattern 220 may extend along the side surface 114s of the fin region 114 and the top surface 120u of the device isolation layer 120. For example, the first work function pattern 220 may horizontally extend along the top surface 120u of the device isolation layer 120, and may vertically extend on the side surface 114s of the fin region 114.

The first work function pattern 220 in the first deep trench 136 may have a first thickness T1, and the first work function pattern 220 in the second deep trench 138 may have a second thickness T2 less than the first thickness T1. The first and second thicknesses T1 and T2 may be a distance between the top and bottom surfaces of the first work function pattern 220. The first work function pattern 220 in the first deep trench 136 may have a top surface at a level higher than that of a top surface of the first work function pattern 220 in the second deep trench 138.

In an exemplary embodiment of the present inventive concept, the word line structure 200 may further include the barrier pattern and the third work function pattern discussed in more detail above with reference to FIGS. 6A and 6B. The barrier pattern and the third work function pattern may be provided between the gate capping pattern 250 and the gate electrode pattern 240, and may extend between the gate capping pattern 250 and the second work function pattern 230.

The formation of the first work function pattern 220 may be substantially the same as that discussed with reference to FIGS. 4A and 4B. When a material is deposited to form the first work function pattern 220 having a greater work function than that of the gate electrode pattern 240, a deposited amount of the material may be larger than that in the case discussed with reference to FIGS. 4A and 4B, thus increasing a channel threshold voltage.

According to an exemplary embodiment of the present inventive concept, gate induced junction leakage and gate induced drain leakage may be blocked or reduced, thus increasing desired electrical conductivity of semiconductor devices.

Figure 12A:
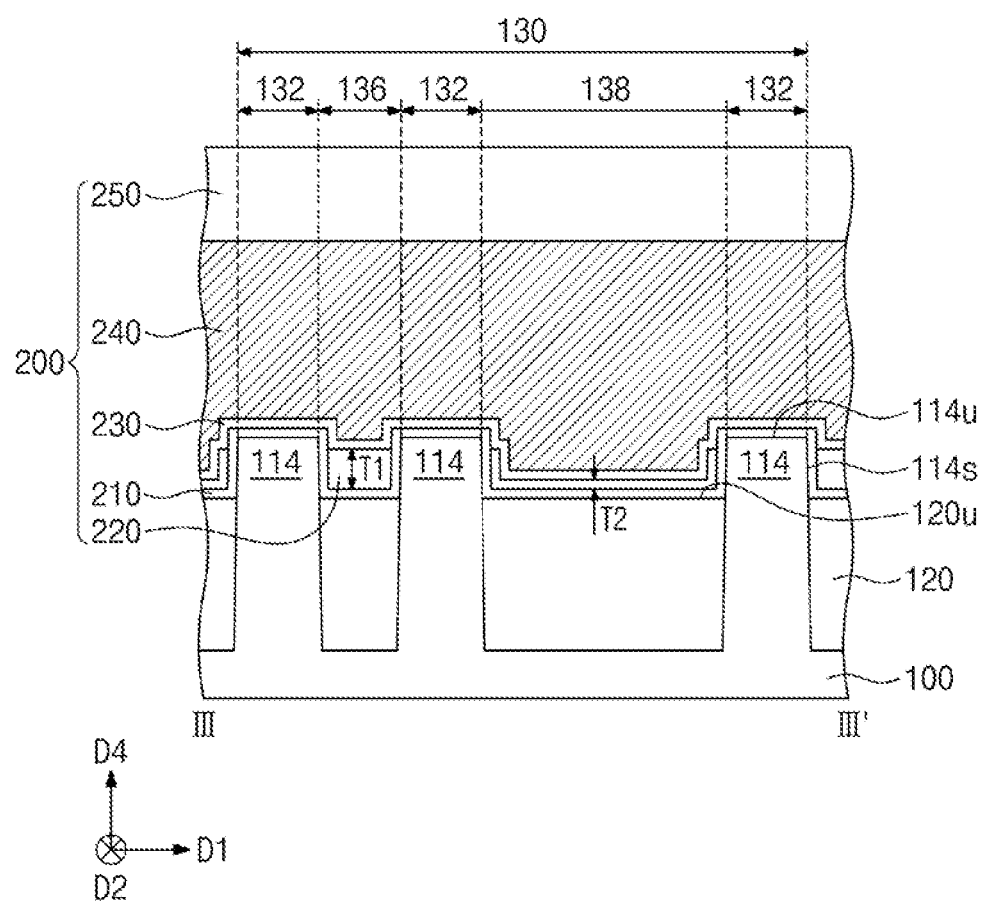
FIG. 12A illustrates an enlarged view corresponding to section CC of FIG. 10, and illustrates a semiconductor device according to an exemplary embodiment of the present inventive concept.
Figure 12B:
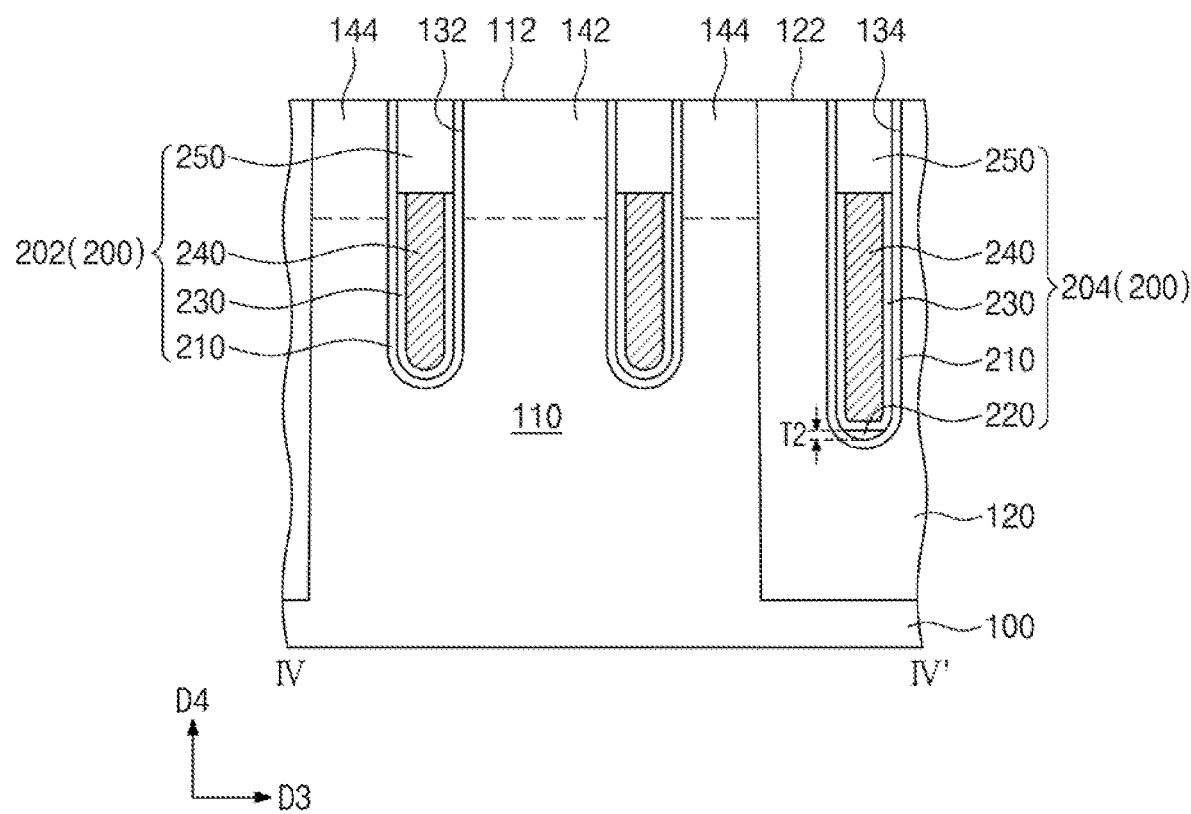
FIG. 12B illustrates an enlarged view corresponding to section DD of FIG. 10, and illustrates a semiconductor device according to an exemplary embodiment of the present inventive concept.
Figure 12C:
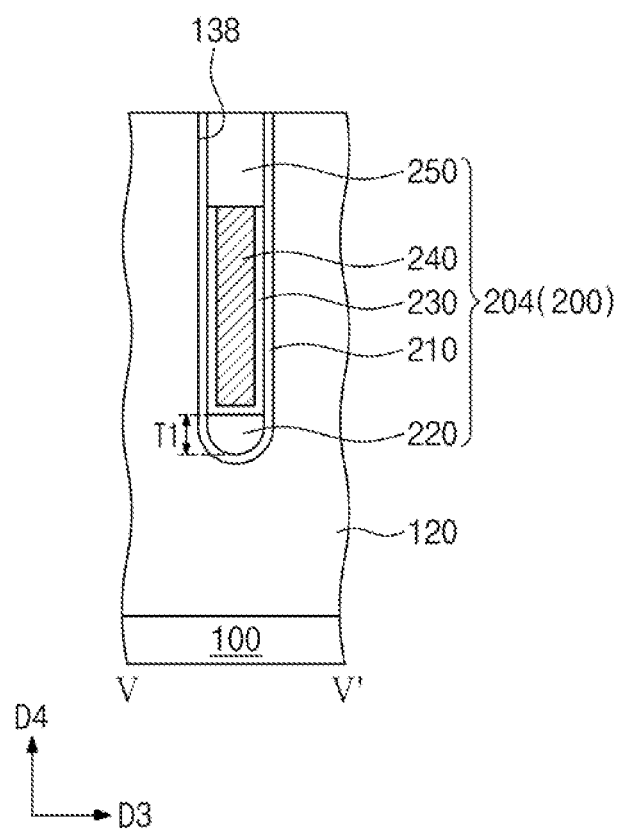
FIG. 12C illustrates an enlarged view corresponding to section EE of FIG. 10, and illustrates a semiconductor device according to an exemplary embodiment of the present inventive concept.

FIG. 12A illustrates an enlarged view corresponding to section CC of FIG. 10, and illustrates a semiconductor device according to an exemplary embodiment of the present inventive concept. FIG. 12B illustrates an enlarged view corresponding to section DD of FIG. 10, and illustrates a semiconductor device according to an exemplary embodiment of the present inventive concept. FIG. 12C illustrates an enlarged view corresponding to section EE of FIG. 10, and illustrates a semiconductor device according to an exemplary embodiment of the present inventive concept. Descriptions of components that are the same or substantially the same as those discussed above with reference to FIGS. 1 to 5B, and 9 to 11C may be omitted below.

Referring to FIGS. 9, 10, 12A, 12B, and 12C, the first work function pattern 220 need not be provided on the top surface 114u of the fin region 114. For example, the first work function pattern 220 need not be provided in a lower portion of the shallow trench 132. The first word line structure 202 need not include the first work function pattern 220.

A bottom surface of the second work function pattern 230 and a top surface of the gate insulation pattern 210 may be in direct contact with each other either on the fin region 114 or in a lower portion of the shallow trench 132.

The first work function pattern 220 may be provided on the side surface 114s of the fin region 114 and the top surface 120u of the device isolation layer 120. The first work function pattern 220 may be provided in lower portions of the first and second deep trenches 136 and 138. For example, the second word line structure 204 may include the first work function pattern 220.

In the first deep trench 136, the first work function pattern 220 may substantially fill the first deep trench 136. The first work function pattern 220 may have a substantially flat top surface. The first work function pattern 220 may have a first thickness T1. The first work function pattern 220 in the first deep trench 136 may have a top surface at a level higher than that of a top surface of the first work function pattern 220 in the second deep trench 138. In the second deep trench 138, the first work function pattern 220 may extend along the side surface 114s of the fin region 114 and the top surface 120u of the device isolation layer 120. For example, the first work function pattern 220 may horizontally extend along the top surface 120u of the device isolation layer 120, and may vertically extend on the side surface 114s of the fin region 114. The first work function pattern 220 may have a second thickness T2 less than the first thickness T1.

The first work function pattern 220 may include a plurality of first work function patterns. The plurality of first work function patterns 220 may be arranged along the first direction D1. A pair of first work function patterns 220 directly adjacent to each other may be spaced apart from each other along the first direction D1 across the fin region 114.

In an exemplary embodiment of the present inventive concept, the word line structure 200 may further include the barrier pattern and the third work function pattern discussed in more detail above with reference to FIGS. 6A and 6B. The barrier pattern and the third work function pattern may be provided between the gate capping pattern 250 and the gate electrode pattern 240, and may extend between the gate capping pattern 250 and the second work function pattern 230.

In an exemplary embodiment of the present inventive concept, the formation of the first work function pattern 220 may include, when forming the first work function pattern 220 discussed in more detail above with reference to FIGS. 11A to 11C, substantially simultaneously removing the first work function pattern 220 provided on the top surface 114u of the fin region 114. For example, an anisotropic etching process may be performed to remove the first work function layer on the top surface 114u of the fin region 114.

Figure 13A:
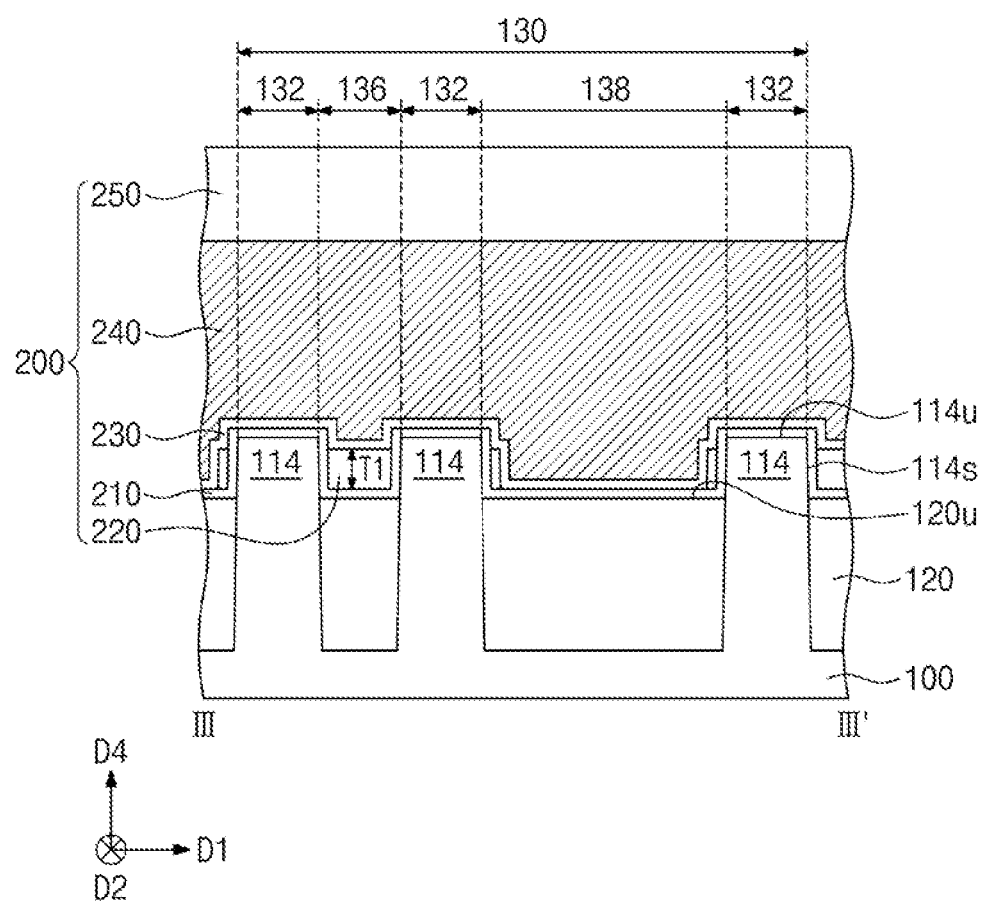
FIG. 13A illustrates an enlarged view corresponding to section CC of FIG. 10, and illustrates a semiconductor device according to an exemplary embodiment of the present inventive concept.
Figure 13B:
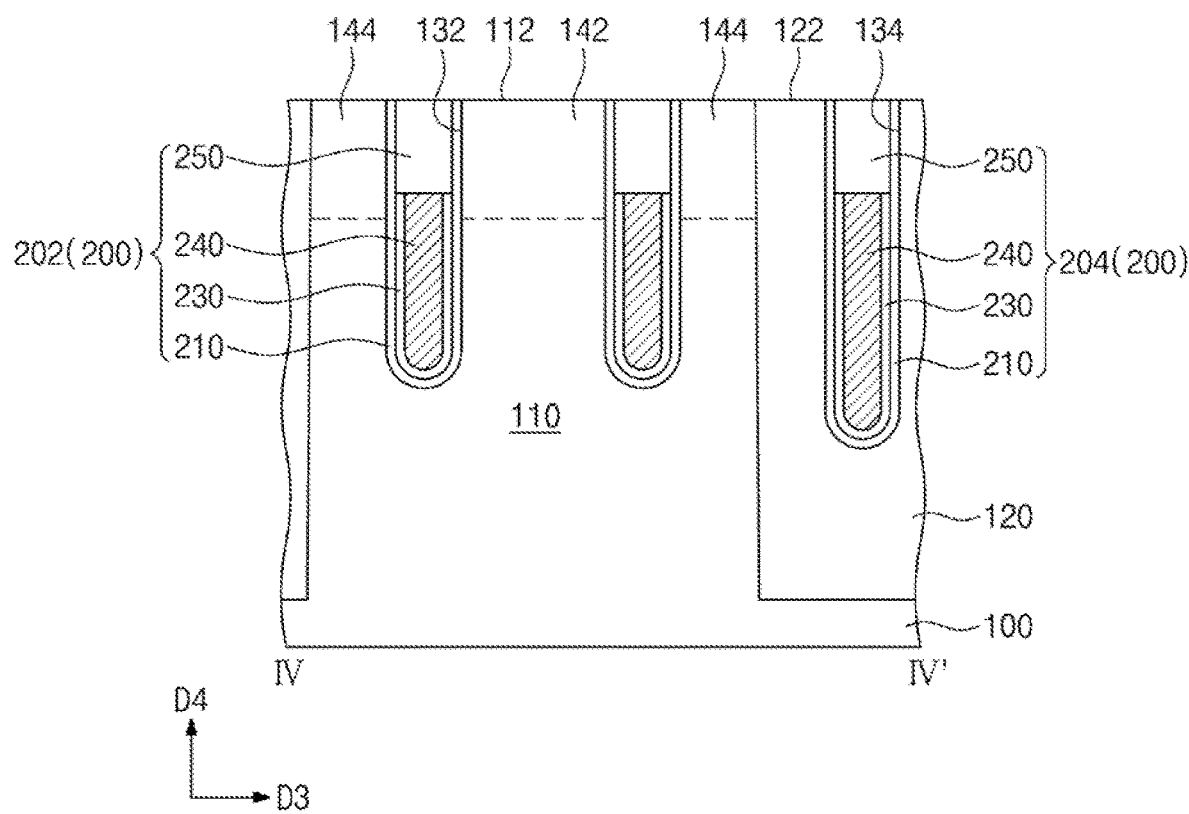
FIG. 13B illustrates an enlarged view corresponding to section DD of FIG. 10, and illustrates a semiconductor device according to an exemplary embodiment of the present inventive concept.
Figure 13C:
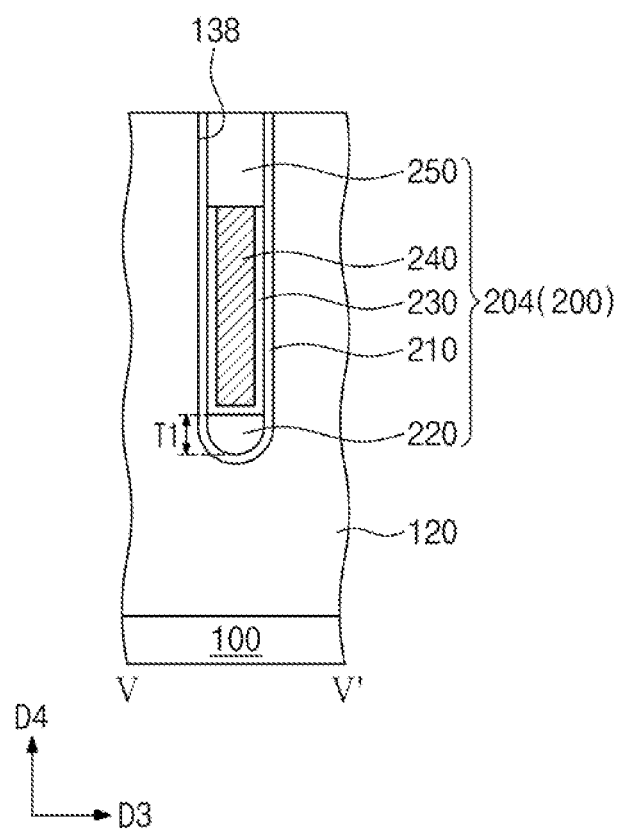
FIG. 13C illustrates an enlarged view corresponding to section EE of FIG. 10, and illustrates a semiconductor device according to an exemplary embodiment of the present inventive concept.

FIG. 13A illustrates an enlarged view corresponding to section CC of FIG. 10, and illustrates a semiconductor device according to an exemplary embodiment of the present inventive concept. FIG. 13B illustrates an enlarged view corresponding to section DD of FIG. 10, and illustrates a semiconductor device according to an exemplary embodiment of the present inventive concept, FIG. 13C illustrates an enlarged view corresponding to section EE of FIG. 10, and illustrates a semiconductor device according to an exemplary embodiment of the present inventive concept. Descriptions of components that are the same or substantially the same as those discussed above with reference to FIGS. 1 to 5B, 9 to 11C, and 12A to 12C may be omitted below.

Referring to FIGS. 9, 10, 13A, 13B, and 13C, the first work function pattern 220 in the first deep trench 136 may be substantially the same as that discussed above with reference to FIGS. 12A to 12C.

In the second deep trench 138, the first work function pattern 220 need not be provided on the top surface 120u of the device isolation layer 120. Referring to FIG. 13B, the second word line structure 204 in the second deep trench 138 need not include the first work function pattern 220. Referring to FIG. 13A, the second word line structure 204 in the second deep trench 138 may include the first work function pattern 220 at an area directly adjacent to the side surface 114s of the fin region 114. The first work function pattern 220 may vertically extend. In this configuration, the gate insulation pattern 210 and the second work function pattern 230 may be sequentially stacked on the top surface 120u of the device isolation layer 120. A bottom surface of the second work function pattern 230 and a top surface of the gate insulation pattern 210 may be in direct contact with each other in a lower portion of the second deep trench 138.

The first work function pattern 220 may be provided on the side surface 114s of the fin region 114. Accordingly, the first work function pattern 220 may be provided in a pair spaced apart from each other along the first direction D1 in the second deep trench 138. In the second deep trench 138, the pair of first work function patterns 220 may be correspondingly provided on facing side surfaces 114s of a pair of fin regions 114 directly adjacent to each other. In an exemplary embodiment of the present inventive concept, the word line structure 200 may further include the barrier pattern and the third work function pattern discussed in more detail above with reference to FIGS. 6A and 6B. The barrier pattern and the third work function pattern may be provided between the gate capping pattern 250 and the gate electrode pattern 240, and may extend between the gate capping pattern 250 and the second work function pattern 230.

In an exemplary embodiment of the present inventive concept, the formation of the first work function pattern 220 may include, when forming the first work function pattern 220 discussed in more detail above with reference to FIGS.

4A and 4B, substantially simultaneously removing the first work function pattern 220 provided on the top surface 114u of the fin region 114 and the top surface 120u of the device isolation layer 120. For example, an anisotropic etching process may be performed to remove the first work function layer on the top surface 114u of the fin region 114 and the top surface 120u of the device isolation layer 120.

According to an exemplary embodiment of the present inventive concept, gate induced junction leakage and gate induced drain leakage may be blocked or reduced to increase accuracy of a desired electrical conductivity of semiconductor devices.

A semiconductor device according to an exemplary embodiment of the present inventive concept may reduce or substantially eliminate a leakage current.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A semiconductor device, comprising:
    a substrate including an active region defined by a device isolation layer; and
    a word line structure in a trench formed in an upper portion of the substrate,
    wherein the word line structure comprises:
        a gate insulation pattern covering an inner surface of the trench;
        a gate electrode pattern on the gate insulation pattern;
        a first work function pattern between the gate insulation pattern and the gate electrode pattern; and
        a second work function pattern on the first work function pattern and extending along a side surface of the gate electrode pattern,
        wherein the first work function pattern has a topmost surface at a level below that of a bottommost surface of the gate electrode pattern, and has a work function greater than that of the second work function pattern,
    wherein the bottommost surface of the gate electrode pattern is a surface of the gate electrode pattern nearest to a bottommost surface of the trench, the bottommost surface of the trench is a baseline level.

2. The semiconductor device of claim 1, wherein a side surface of the gate insulation pattern is in direct contact with the second work function pattern along a side surface of the trench.

3. The semiconductor device of claim 1, wherein the active region comprises a fin region connected to at least a portion of the trench, wherein
    the fin region protrudes from a top surface of the device isolation layer,
    the first work function pattern is provided on a side surface of the fin region, and
    the second work function pattern extends along a top surface and the side surface of the fin region and along the top surface of the device isolation layer.

4. The semiconductor device of claim 3, wherein the first work function pattern includes a plurality of first work function patterns, wherein the plurality of first work function patterns are each provided on opposite side surfaces of the fin region, and wherein the plurality of first work function patterns are provided along a first direction parallel to a top surface of the substrate.

5. The semiconductor device of claim 3, wherein the second work function pattern and the gate insulation pattern are in direct contact with each other on the top surface of the device isolation layer and the top surface of the fin region.

6. The semiconductor device of claim 3, wherein the first work function pattern extends along the top surface of the device isolation layer.

7. The semiconductor device of claim 6, wherein the first work function pattern extends along the top surface of the fin region.

8. The semiconductor device of claim 3, wherein the fin region includes plurality of fin regions, and the plurality of fin regions comprise a first pair of fin regions directly adjacent to each other and a second pair of fin regions directly adjacent to each other, the first pair of fin regions being relatively closer to each other than the second pair of fin regions,
    wherein a portion of the first work function pattern between the first pair of fin regions substantially fills a space between the first pair of fin regions and has a flat topmost surface.

9. The semiconductor device of claim 8, wherein the second work function pattern and the gate insulation pattern are in direct contact with each other between the second pair of fin regions.

10. The semiconductor device of claim 8, wherein the first work function pattern between the second pair of fin regions extends along opposite side surfaces of the first pair of fin regions and along the top surface of the device isolation layer between the second pair of fin regions.

11. The semiconductor device of claim 10, wherein the first work function pattern between the first pair of fin regions has a first thickness greater than a second thickness of the first work function pattern between the second pair of fin regions.

12. The semiconductor device of claim 1, wherein the word line structure further comprises a barrier pattern and a third work function pattern sequentially stacked on the gate electrode pattern,
    wherein the third work function pattern has a work function less than that of the second work function pattern.

13. A semiconductor device, comprising:
    a device isolation layer;
    an active fin region protruding from a top surface of the device isolation layer; and
    a word line structure disposed on a trench in the device isolation layer,
    wherein the word line structure disposed on the trench comprises:
        a gate insulation pattern covering an entire inner surface of the trench including covering a top surface of the device isolation layer;
        a gate electrode pattern;
        a first work function pattern between the gate electrode pattern and the active fin region; and
        a second work function pattern between the first work function pattern and the gate electrode pattern and extending along a side surface of the gate electrode pattern,
        wherein the first work function pattern has a work function greater than that of the second work function pattern.

14. The semiconductor device of claim 13, wherein the active fin region includes a plurality of active fin regions, wherein the plurality of active fin regions comprise a first pair of active fin regions directly adjacent to each other and a second pair of active fin regions directly adjacent to each other, wherein a distance between the first pair of active fin regions is less than a distance between the second pair of active fin regions,
- a first word line structure between the first pair of active fin regions; and
- a second word line structure between the second pair of active fin regions,
- wherein a portion of the first work function pattern in the first word line structure is provided between the gate electrode pattern in the first word line structure and the device isolation layer directly adjacent to the first word line structure, and extends along the top surface of the device isolation layer.

15. The semiconductor device of claim 14, wherein
- a portion of the first work function pattern in the second word line structure is provided between the gate electrode pattern in the second word line structure and the device isolation layer directly adjacent to the second word line structure, and extends along the top surface of the device isolation layer, and
- the first work function pattern in the first word line structure has a thickness greater than that of the first work function pattern in the second word line structure.

16. The semiconductor device of claim 15, wherein the first work function pattern in the first word line structure has a top surface at a level higher than that of a top surface of the first work function pattern in the second word line structure.

17. The semiconductor device of claim 15, wherein the first work function pattern in the first word line structure has a top surface at a substantially uniform level with respect to the top surface of the device isolation layer.

18. The semiconductor device of claim 15, wherein
- the second work function pattern in the first word line structure extends along a top surface of the first work function pattern in the first word line structure, and
- the second work function pattern in the second word line structure extends along the top surface of the device isolation layer directly adjacent to the second word line structure.

19. A semiconductor device, comprising:
- a device isolation layer defining a fin region;
- at least one trench formed below an upper surface of the device isolation layer;
- a gate insulation pattern disposed on side surfaces and an upper surface of the fin region;
- a first work function pattern disposed on the gate insulation pattern;
- a second work function pattern disposed on the first work function pattern; and
- a gate electrode pattern disposed on the second work function pattern,
- wherein the gate insulation pattern is conformally disposed on side surfaces and a bottom surface of the at least one trench,
- wherein the first work function pattern is disposed on a portion of the gate insulation pattern disposed on the bottom surface of the at least one trench,
- wherein the second work function pattern is disposed on a portion of the gate insulation pattern disposed on the side surfaces of the at least one trench and on the first work function pattern on the bottom surface of the at least one trench,
- wherein the gate electrode pattern is disposed on the second work function pattern in the at least one trench,
- wherein the first work function pattern has a topmost surface at a level below that of a bottommost surface of the gate electrode pattern, and has a work function greater than that of the second work function pattern,
- wherein the bottommost surface of the gate electrode pattern is a surface of the gate electrode pattern nearest to a bottommost surface of the at least one trench, the bottommost surface of the at least one trench is a baseline level.

20. The semiconductor device of claim 19, wherein the first work function pattern has a work function greater than that of the second work function pattern.

* * * * *